United States Patent
Forrest

(10) Patent No.: US 7,414,294 B2
(45) Date of Patent: Aug. 19, 2008

(54) INTERMEDIATE-BAND PHOTOSENSITIVE DEVICE WITH QUANTUM DOTS HAVING TUNNELING BARRIER EMBEDDED IN ORGANIC MATRIX

(75) Inventor: Stephen R. Forrest, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 414 days.

(21) Appl. No.: 11/304,687

(22) Filed: Dec. 16, 2005

(65) Prior Publication Data

US 2007/0162263 A1 Jul. 12, 2007

(51) Int. Cl.
H01L 27/14 (2006.01)
(52) U.S. Cl. .............. 257/431; 257/40; 257/9
(58) Field of Classification Search ........ 257/431, 257/40, 9
See application file for complete search history.

(56) References Cited

U.S. PATENT DOCUMENTS

| | | | |
|---|---|---|---|
| 5,079,601 A | 1/1992 | Esaki et al. | |
| 6,352,777 B1 | 3/2002 | Bulovic et al. | |
| 6,580,027 B2 | 6/2003 | Forrest et al. | |
| 6,583,436 B2 | 6/2003 | Petroff et al. | |
| 6,657,378 B2 | 12/2003 | Forrest et al. | |
| 6,753,273 B2 | 6/2004 | Holonyak, Jr. et al. | |
| 2004/0209416 A1 | 10/2004 | Holonyak, Jr. et al. | |
| 2005/0155641 A1 | 7/2005 | Fafard | |
| 2007/0137693 A1* | 6/2007 | Forrest ............... 136/255 | |

FOREIGN PATENT DOCUMENTS

WO WO 03/081683 10/2003
WO WO 2004/053929 6/2004

OTHER PUBLICATIONS

Ebiko et al., "Island size scaling in InAs/GaAs self-assembled quantum dots," Physical Review Letters 80: 2650-2653, 1998.
Luque et al., "Progress towards the practical implementation of the intermediate band solar cell," Conference Record of the Twenty-Ninth IEEE Photovoltaic Specialists Conference: 1190-1193, 2002.

(Continued)

*Primary Examiner*—Mark Prenty
(74) *Attorney, Agent, or Firm*—McDermott Will & Emery LLP

(57) ABSTRACT

A plurality of quantum dots each have a shell. The quantum dots are embedded in an organic matrix. At least the quantum dots and the organic matrix are photoconductive semiconductors. The shell of each quantum dot is arranged as a tunneling barrier to require a charge carrier (an electron or a hole) at a base of the tunneling barrier in the organic matrix to perform quantum mechanical tunneling to reach the respective quantum dot. A first quantum state in each quantum dot is between a lowest unoccupied molecular orbital (LUMO) and a highest occupied molecular orbital (HOMO) of the organic matrix. Wave functions of the first quantum state of the plurality of quantum dots may overlap to form an intermediate band.

46 Claims, 13 Drawing Sheets

OTHER PUBLICATIONS

Marti et al., "Design constraints of quantum-dot intermediate band solar cell," Physica E 14: 150-157, 2002.

Ng, "Complete guide to semiconductor devices," 2nd ed., Appendix B8, Tunneling, 625-627, Wiley-Interscience, 2002.

Pierret, "Modular series on solid state devices vol. VI, advanced semiconductor fundamentals," Chapter 2, Elements of Quantum Mechanics, 25-51, Addison-Wesley Publishing, 1989.

Cuadra et al., "Phonon bottleneck effect and photon absorption in self-ordered quantum dot intermediate band solar cells", Presented at the Nineteeth European Photovoltaic Solar Energy Conference and Exhibition, Paris, France, Jun. 7-11, 2004.

Benson et al., "Regulated and entangled photons from a single quantum dot", Phys. Rev. Letts. 84(11): 2513-2516, 2000.

Chu et al., "An Improved analytic model for the metal-insulator-semiconductor tunnel junction", IEEE Transactions on Electron Devices 35(10): 1656-1663, 1988.

Rubinelli, "Direct tunneling at the front contact of amorphous silicon p-i-n devices", IEEE Transactions on Electron Devices 39(11): 2584-2591, 1992.

Wang et al., "Interface trap effect on gate induced drain leakage current in submicron N-MOSFET'S", IEEE Transactions on Electron Devices 41(12): 2475-2477, 1994.

Pettersson et al., "Dependence of the $I$-$V$ curve of a metal insulator semiconductor switch on insulator thickness—An experimental and theoretical investigation", IEEE Transactions on Electron Devices 45(1): 286-292, 1998.

Ielmini et al, "Modeling of SILC based on electron and hole tunneling—Part II: Steady-state", IEEE Transactions on Electron Devices 47(6): 1266-1272, 2000.

Han et al., "Programming characteristics of P-channel Si nano-crystal memory", IEEE Transactions on Electron Devices 21(6): 313-315, 2000.

Yeo et al., "Direct tunneling gate leakage current in transistors with ultrathin silicon nitride gate dielectric", IEEE Transactions on Electron Devices 21(11): 540-542, 2000.

Ancona et al., "Density-gradient analysis of MOS tunneling", IEEE Transactions on Electron Devices 47(12): 2310-2319, 2000.

Chi et al., "New characteristics of direct hole tunneling through ultrathin gate oxide (2.7nm) in p+/pMOS and its applications", Proceedings of IEEE Electron Devices Meeting, Hong Kong, pp. 100-103, 2000.

Han et al., "Charcateristics of P-channel Si nano-crystal memory",IEEE Transactions on Electron Devices 48(5): 874-879, 2001.

Lee et al., "Modeling CMOS tunneling currents through ultrathin gate oxide due to conduction-and valence-band electron and hole tunneling", IEEE Transactions on Electron Devices 48(7): 1366-1373, 2001.

Yu et al., "Hole tunneling current through oxynitride/oxide stack and the stack optimization for p-MOSFETs", IEEE Electron Device Letters 23(5): 285-287, 2002.

Yu et al., "Investigation of hole-tunneling current through ultrathin oxynitride/oxide stack gate dielectrics in p-MOSFETs", IEEE Transactions on Electron Devices 49(7): 1158-1164, 2002.

Sato et al., "Up-conversion by using Γ-X-Γ carrier transport in asymmetric double quantum well systems", IEEE Conference on Optoelectronic and Microelectronic Materials and Devices, pp. 285-288, 2002.

Cuadra et al., "Influence of the overlap between the absorption coefficients on the efficiency of the intermediate band solar cell," IEEE Transactions on Electron Devices 51(6): 1002-1007, 2004.

Casperson et al., "Materials issues for layered tunnel barrier structures", J. Appl. Phys. 92(1): 261-267, 2002.

Leon et al., "Microstructural evolution near the InGaAs/GaAs Stranski-Krastanow transformation", Poster, NASA Jet Propulsion Laboratory, 2002.

Marti et al., "Partial filling of a quantum dot intermediate band for solar cells", IEEE Transactions on Electron Devices 48(10): 2394-2399, 2001.

Klimeck et al., "Transverse momentum dependence of electron and hole tunneling in a full band tigh-binding simulation", Proceedings of the 27th International Symposium on Compound Semiconductors (ISCS), IEEE: 257-262, 2000.

Sugiyama et al., "Spectral hole burning memory using InAs self-assembled quantum dots", FUJITSU Sci. Tech. J. 34(2): 182-190, 1998.

Visser et al., "Entangled photons from small quantum dots", Phys. Rev. A 68, 053805, pp. 1-10, 2003.

Chang et al., "Hole emission processes in InAs/GaAs self-assembled quantum dots", Phys. Rev. B 66, 195337, pp. 1-8, 2002.

Lyon, "Self-assembled InAs quantum dots", Princeton University Dept. of Electrical Engineering, slideshow, 48 pages, 2004.

Bödefeld et al., "Storage of electrons and holes in self-assembled InAs quantum dots", Appl. Phys. Rev. 74(13): 1839-1841, 1999.

Seifert et al., "Quantum dots grown in-situ by MOVPE: Sizes, densities and optical properties", Brazilian J. Phys 27/A(4): 3-11, 1997.

Amano et al., "1.3-um InAs Quantum-Dot Laser With High Dot Density and High Uniformity," IEEE Photonics Technology Letters, vol. 18, No. 4, pp. 619-621, 2006).

Liang et al., "Broad-Band Photoresponse From InAs Quantum Dots Embedded Into InGaAs Graded Well," IEEE Electron Device Letters, vol. 26, No. 9, pp. 631-633, 2005.

Stintz et al., "Low-Threshold Current Density 1.3-um InAs Quantum-Dot Lasers with the Dots-in-a-Well (DWELL) Structure," IEEE Photonics Technology Letters, vol. 12, No. 6, pp. 591-593, 2000.

Newell et al., "Gain and Linewidth Enhancement Factor in InAs Quantum-Dot Laser Diodes," IEEE Photonics Technology Letters, vol. 11, No. 12, pp. 1527-1529, 1999.

Arici et al., "Core/shell nanomaterials in photovoltaics," International Journal of Photoenergy, vol. 5, pp. 199-208, 2003.

Chen et al., "Spectroscopy and femtosecond dynamics of type-II CdSe/ZnTe core-shell semiconductor synthesized via the CdO precursor," J. Phys. Chem. B, vol. 108, pp. 10687-10691, 2004.

Taguchi et al., "Improving the performance of solid-state dye-sensitized solar cell using MgO-coated $TiO_2$ nanoporous film," Chem. Commun. pp. 2480-2481, 2003.

International Search Report dated Apr. 17, 2007, International Application No. PCT/US2006/046946, filed Dec. 7, 2006.

* cited by examiner

FIG. 1
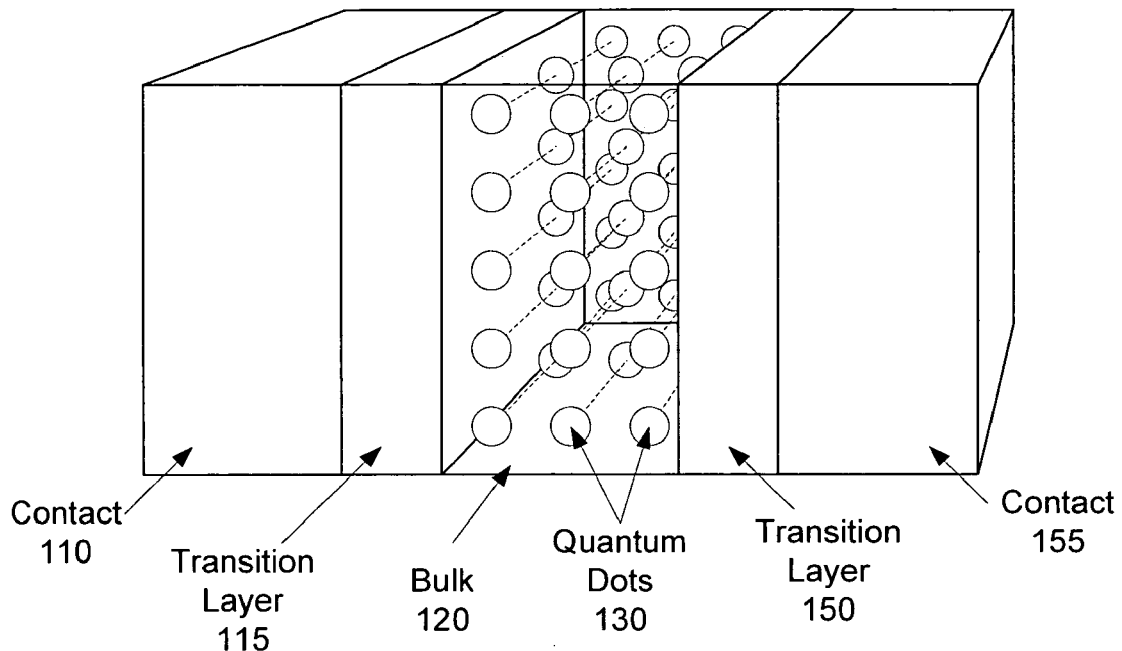
Contact 110  
Transition Layer 115  
Bulk 120  
Quantum Dots 130  
Transition Layer 150  
Contact 155
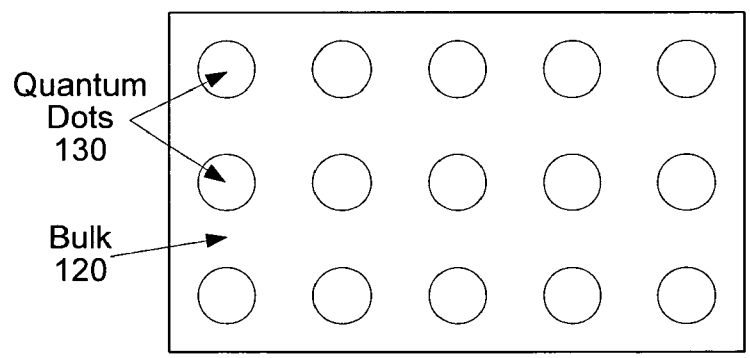
Quantum Dots 130  
Bulk 120
FIG. 5
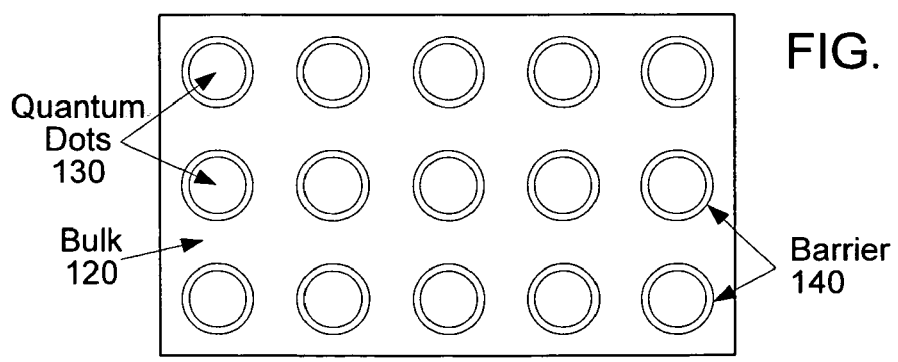
Quantum Dots 130  
Bulk 120  
Barrier 140
FIG. 7

INTERMEDIATE-BAND PHOTOSENSITIVE DEVICE WITH QUANTUM DOTS HAVING TUNNELING BARRIER EMBEDDED IN ORGANIC MATRIX

UNITED STATES GOVERNMENT RIGHTS

This invention was made with U.S. Government support under Contract No. 339-4012 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to photosensitive optoelectronic devices. More specifically, it is directed to intermediate-band photosensitive optoelectronic devices with organic or inorganic quantum dots providing the intermediate band in an organic semiconductor matrix.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. There may be intervening layers, unless it is specified that the first layer is "in physical contact with" or "in direct contact with" the second layer.

When electromagnetic radiation of an appropriate energy is incident upon an organic semiconductor material, a photon can be absorbed to produce an excited state. In organic photoconductive materials, the generated excited molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron and hole forming the exciton are typically separated at a rectifying junction.

Excitons also form in inorganic semiconductors. However, the Coulomb interaction between electrons and holes in inorganic materials is weaker than in organic materials, such that the electron and hole may disassociate in inorganic materials before reaching a rectifying junction.

In the case of photosensitive devices, the rectifying junction is referred to as a photovoltaic heterojunction. To produce internally generated electric fields at the photovoltaic heterojunction which occupy a substantial volume, the usual method is to juxtapose two layers of material with appropriately selected semi-conductive properties, especially with respect to their distribution of energy states.

Types of organic photovoltaic heterojunctions include a donor-acceptor heterojunction formed at an interface of a donor material and an acceptor material, and a Schottky-barrier heterojunction formed at the interface of a organic photoconductive material and a metal. Types of inorganic photovoltaic heterojunctions include a p-n heterojunction formed at an interface of a p-type doped material and an n-type doped material, and a Schottky-barrier heterojunction formed at the interface of an inorganic photoconductive material and a metal. A photovoltaic heterojunction can also be formed at an interface between an inorganic material and an organic material.

In organic photovoltaic heterojunctions, the materials forming the heterojunctions have been denoted as being donors or acceptors. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

Organic semiconductors and insulators may have additional discrete molecular orbitals below the HOMO and above the LUMO, typically identified as HOMO−1, HOMO−2, LUMO+1, LUMO+2, etc.

The use of "donor" and "acceptor" with organic materials has a different meaning than with inorganic materials. In the context of organic materials, the terms "donor" and "acceptor" refer to the relative positions of the HOMO and LUMO energy levels of two contacting but different materials. This is in contrast to the use of these terms in the inorganic context, where "donor" and "acceptor" may refer to types of dopant atoms that may be used to create inorganic n- and p- types layers, respectively.

One common feature of semiconductors and insulators is a "band gap." The band gap is the energy difference between the highest energy level filled with electrons and the lowest energy level that is ordinarily empty. In an inorganic semiconductor or inorganic insulator, this energy difference is the difference between the valence band edge $E_V$ (top of the valence band) and the conduction band edge $E_C$ (bottom of the conduction band). In an organic semiconductor or organic insulator, this energy difference is the difference between the HOMO and the LUMO. The band gap of a pure material is devoid of energy states where electrons and holes can exist. The only available carriers for conduction are the electrons and holes which have enough energy to be excited across the band gap. In general, semiconductors have a relatively small band gap in comparison to insulators.

In terms of an energy band/level model, excitation of a valence band electron in an inorganic semiconductor into the conduction band creates carriers; that is, electrons are charge carriers when on the conduction band side of the band gap, and holes are charge carriers when on the valence band side of the band gap. Likewise, for organic semiconductors, electrons are charge carriers when on the unoccupied molecular orbital side of the band gap, and holes are charge carriers when on the occupied molecular orbital side of the band gap. Put more succinctly, electrons are carriers above the band gap, and holes are carriers below the band gap.

As used herein, a first energy level is "above," "greater than," or "higher than" a second energy level if the first energy level is closer to the vacuum energy level. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

As is the convention with energy band diagrams, it is energetically favorable for electrons to move to a lower energy level, whereas it is energetically favorable for holes to move to a higher energy level (which is a lower potential energy for a hole, but is higher relative to an energy band diagram). Put more succinctly, electrons fall down whereas holes fall up.

Carrier mobility is a significant property in inorganic and organic semiconductors. Mobility measures the ease with which a charge carrier can move through a conducting material in response to an electric field. In the context of photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material (organic) and an n-type material (inorganic) are electron transport materials; and a donor material (organic) and a p-type material (inorganic) are hole transport materials. In comparison to semiconductors, insulators generally provide poor carrier mobility.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A plurality of quantum dots each have a shell and are embedded in an organic matrix. At least the quantum dots and organic matrix are photoconductive semiconductors. The shell around each quantum dot is arranged as a tunneling barrier to require a charge carrier (an electron or a hole) at a base of the tunneling barrier in the organic matrix to perform quantum mechanical tunneling to reach the respective quantum dot. A first quantum state in each quantum dot is between a lowest unoccupied molecular orbital (LUMO) and a highest occupied molecular orbital (HOMO) of the organic matrix in which the quantum dots are embedded. Wave functions of the first quantum state of the plurality of quantum dots may overlap to form an intermediate band.

The first quantum state is a quantum state above a band gap in the quantum dot in a case where the charge carrier is an electron. The first quantum state is a quantum state below the band gap of the quantum dot in a case where the charge carrier is a hole.

Each quantum dot may also have a second quantum state. The second quantum state is above the first quantum state and within ±0.16 eV of the LUMO of the organic matrix in the case where the charge carrier is the electron. The second quantum state is below the first quantum state and within ±0.16 eV of the HOMO of the organic matrix in the case where the charge carrier is the hole.

A height of the tunneling barrier is an absolute value of an energy level difference between a peak and the base of the tunneling barrier. A combination of the height and potential profile of the tunneling barrier and a thickness of the shell around each quantum dot may correspond to a tunneling probability between 0.1 and 0.9 that the charge carrier will tunnel into the respective quantum dot from the organic matrix. With the tunneling probability between 0.1 and 0.9, the thickness of the shell is preferably in a range of 0.1 to 10 nanometers.

More preferably, the combination of the height and potential profile of the tunneling barrier and the thickness of the shell around each quantum dot corresponds to a tunneling probability between 0.2 and 0.5 that the charge carrier will tunnel into the respective quantum dot from the organic matrix. With the tunneling probability between 0.2 and 0.5, the thickness of the shell is preferably in a range of 0.1 to 10 nanometers.

The organic matrix may be composed of a photoconductive small molecule semiconductor, or may be composed of a photoconductive polymer semiconductor.

If the each quantum dot is composed of an inorganic semiconductor, the shell around the respective quantum dot may be an inorganic semiconductor, an inorganic electrical insulator, an organic semiconductor, or an organic electrical insulator.

With the quantum dots being composed of an inorganic semiconductor, the embedded quantum dots can be arranged in a device further comprising an organic donor layer and an organic acceptor layer in superposed relationship, the quantum dots embedded in the organic matrix being disposed between the donor layer and the acceptor layer. A lowest unoccupied molecular orbital (LUMO) of the donor layer is preferably higher than the peak of the tunneling barrier in the case where the charge carrier is the electron. A highest occupied molecular orbital (HOMO) of the acceptor layer is preferably lower than the peak of the tunneling barrier in the case where the charge carrier is the hole.

If each quantum dot is composed of an organic semiconductor, the shell around the respective quantum dot may be an organic semiconductor or an organic electrical insulator.

With the quantum dot being an organic semiconductor, the embedded quantum dots can be arranged in a device further comprising an organic donor layer and an organic acceptor layer in superposed relationship, the quantum dots embedded in the organic matrix being disposed between the donor layer and the acceptor layer. A lowest unoccupied molecular orbital (LUMO) of the donor layer is preferably higher than the peak of the tunneling barrier in the case where the charge carrier is the electron. A highest occupied molecular orbital (HOMO) of the acceptor layer is preferably lower than the peak of the tunneling barrier in the case where the charge carrier is the hole.

A quantum dot of the plurality of quantum dots and the shell around the respective dot may be integrated as a single dendrimer molecule. In such a case, the core moiety of the dendrimer molecule may act as the quantum dot, and the chemical shell of the dendrimer molecule may act as a tunneling barrier, i.e., the shell around the quantum dot.

For each quantum dot, a thickness of the shell is preferably in a range of 0.1 to 10 nanometers. More preferably, within the range of 0.1 to 10 nanometers, the thickness of the shell is equal to no more than 10% of an average cross-sectional thickness through a center of a respective quantum dot.

The embedded quantum dots may be arranged in a photosensitive device such as a solar cell.

BRIEF DESCRIPTION OF THE DRAWINGS

FIG. 1 illustrates a intermediate band solar cell.

FIG. 5 illustrates a cross-section of the array of quantum dots in the device in FIG. 1, as generally idealized and as formed in colloidal solutions.

FIG. 7 illustrates a cross-section of an array of quantum dots like that shown in FIG. 5, modified to include a tunneling barrier.

Figure 2A:
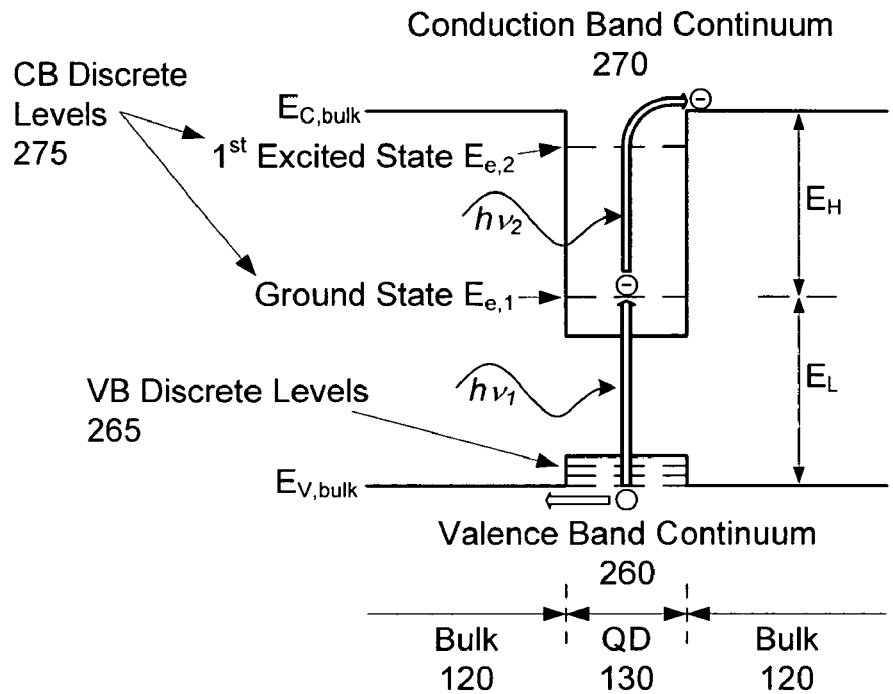
FIGS. 2A and 2B are energy band diagrams for a cross-section of an inorganic quantum dot in an inorganic matrix material, with the lowest quantum state in the conduction band providing the intermediate band.

The figures are not necessarily drawn to scale.

DETAILED DESCRIPTION

One method being explored to improve the efficiency of solar cells is to use quantum dots to create an intermediate band within the bandgap of the solar cell. Quantum dots confine charge carriers (electrons, holes, and/or excitons) in three-dimensions to discrete quantum energy states. The cross-sectional dimension of each quantum dot is typically on the order of hundreds of Ångstroms or smaller. An intermediate-band structure is distinguishable, among other ways, by the overlapping wave functions between dots. The "intermediate" band is the continuous miniband formed by the overlapping wave functions. Although the wave functions overlap, there is no physical contact between adjacent dots.

FIG. 1 illustrates an example of an intermediate-band device. The device comprises a first contact 110, a first transition layer 115, a plurality of quantum dots 130 embedded in a semiconductor bulk matrix material 120, an second transition layer 150, and a second contact 155.

In a device made of inorganic materials, one transition layer (115, 150) may be p-type, with the other transition layer being n-type. The bulk matrix material 120 and the quantum dots 130 may be intrinsic (not doped). The interfaces between the transition layers 115, 150 and the bulk matrix material 120 may provide rectification, polarizing current flow within the device.

This same basic pattern of layers may also be used for devices made of organic materials, or a mix of organic and inorganic materials. For example, the transition layers (115, 150) may comprise a donor layer and an acceptor layer, having energy levels offset relative to the bulk matrix material 120, such that the interfaces between the transition layers and the bulk matrix material provide rectification. As an alternative with either organic or inorganic materials, current-flow rectification may be provided by the interfaces between the contacts (110, 155) and the transition layers (115, 150).

Depending upon the arrangement of bands, the intermediate-band may correspond to a lowest quantum state above the band gap in the dots 130, or a highest quantum state below the band gap in the dots 130.

FIGS. 2A, 2B, 3A, and 3B are energy band diagrams for cross-sections through example inorganic quantum dots 130 in an inorganic bulk matrix material 120. Within the dots, the conduction band is divided into quantum states 275, and the valence band is divided into quantum states 265.

Figure 2B:
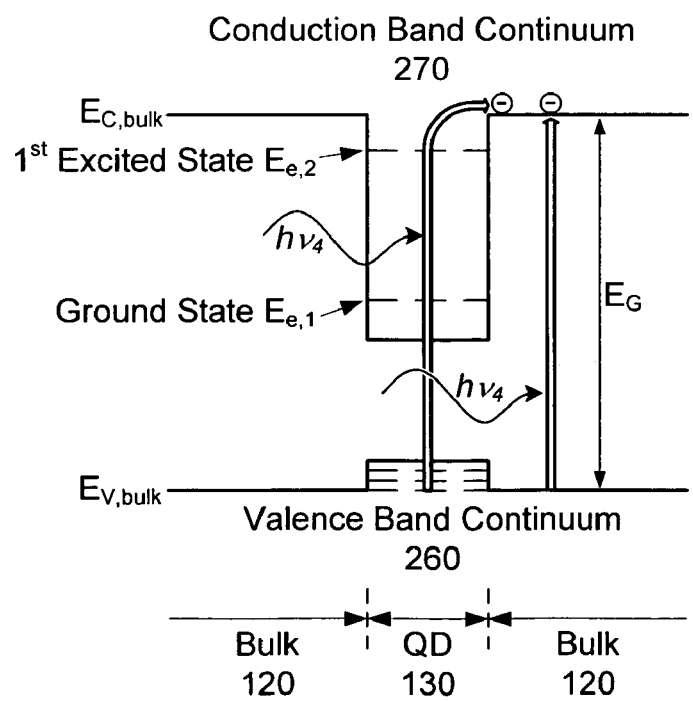

In FIGS. 2A and 2B, the lowest quantum state ($E_{e,1}$) in the conduction band of a dot provides the intermediate band 280. Absorption of a first photon having energy $h\nu_1$ increases the energy of an electron by $E_L$, exciting the electron from the valence band to the conduction band electron ground state $E_{e,1}$ of the quantum dot. Absorption of a second photon having energy $h\nu_2$ increases the energy of the electron by $E_H$, exciting the electron from the ground state $E_{e,1}$ of the quantum dot to the conduction band edge of the bulk semiconductor 120, whereupon the electron is free to contribute to photocurrent. Absorption of a third photon having energy $h\nu_4$ increases the energy of an electron by $E_G$, exciting the electron directly from the valence band into the conduction band (which can also occur in the bulk matrix material 120 itself), whereupon the electron is free to contribute to photocurrent.

Figure 3A:
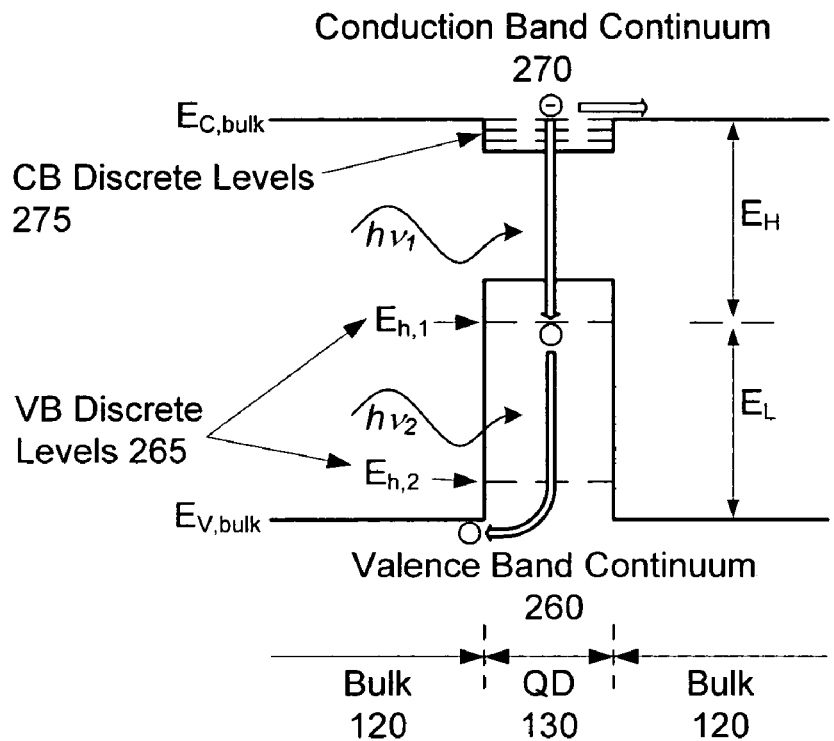
FIGS. 3A and 3B are energy band diagrams for a cross-section of an inorganic quantum dot in an inorganic matrix material, with the highest quantum state in the valence band providing the intermediate band.
Figure 3B:
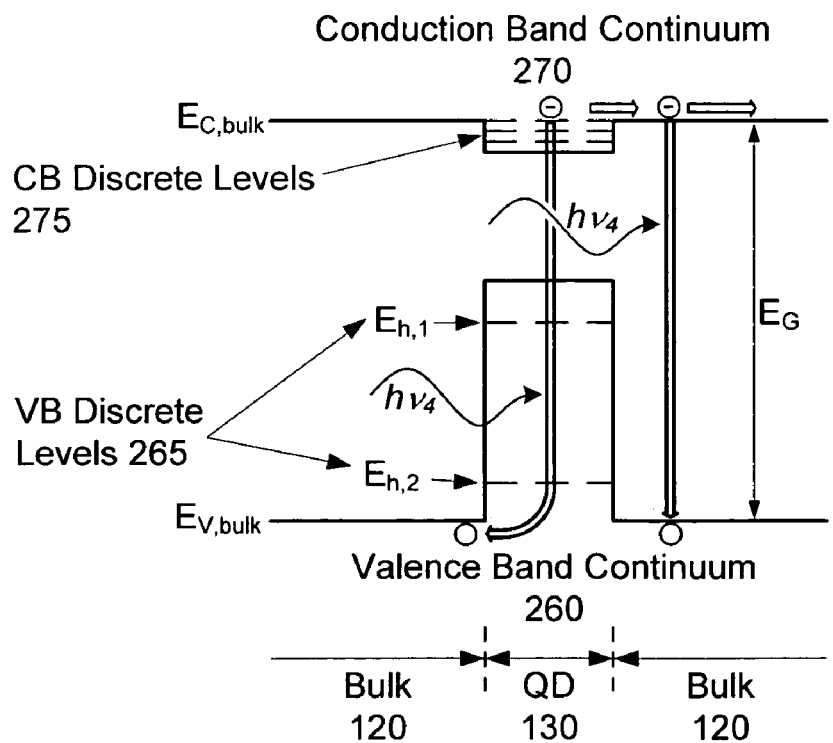

In FIGS. 3A and 3B, the highest quantum state ($E_{h,1}$) in the valence band provides the intermediate band 280. Absorption of a first photon having energy $h\nu_1$ increases the energy of an electron having an energy $E_{h,1}$ by $E_H$, exciting the electron from the valence band side of the band gap into the conduction band, thereby creating an electron-hole pair. Conceptually, this can be thought of as exciting a hole in the conduction band by $E_H$, thereby moving the hole into the $E_{h,1}$ quantum state. Absorption of a second photon having energy $h\nu_2$ increases the potential energy of the hole by $E_L$, exciting the electron from the ground state $E_{h,1}$ of the quantum dot to the valence-band edge of the bulk semiconductor 120, whereupon the hole is free to contribute to photocurrent.

Figure 4:
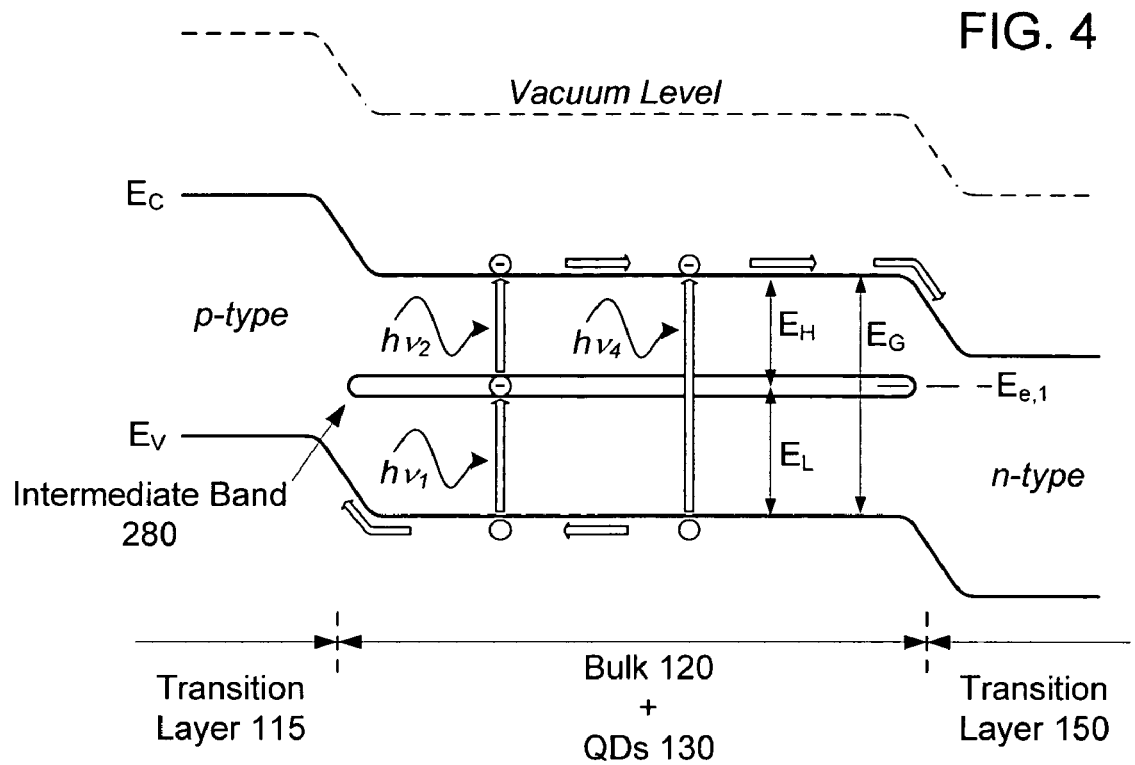
FIG. 4 is an energy band diagram for the intermediate band solar cell of FIG. 1, with inorganic quantum dots in an inorganic matrix material as shown in FIGS. 2A and 2B.

FIG. 4 illustrates an energy band diagram for the intermediate-band device, using an array of dots having the profile demonstrated in FIGS. 2A and 2B. The aggregate of the overlapping wave functions of the $E_{e,1}$ energy state between adjacent quantum dots provides the intermediate band 280 between the conduction band edge ($E_C$) and the valence band edge ($E_V$) of the bulk matrix semiconductor 120. As in the same device if the quantum dots were omitted, absorption of photons of energy $h\nu_4$ generates electron-hole pairs, thereby producing photocurrent. The intermediate band 280 allows the absorption of two sub-band gap photons $h\nu_1$ and $h\nu_2$, leading to the creation of additional photocurrent. In FIG. 4, the transition layers 115 and 150 are arranged to create rectification.

Similar intermediate band arrangements having the same basic structure can be fabricated using organic semiconductors, as well as with mixtures of organic semiconductors as the bulk matrix material and inorganic semiconductors as the quantum dots. If using an organic bulk matrix material 120, the transition layers (115, 150) may comprise an organic donor layer and an organic acceptor layer. If using inorganic quantum dots with the organic bulk matrix material, the $E_{e,1}$ or $E_{h,1}$ energy states may provide the intermediate band. If using organic quantum dots with the organic bulk matrix material, a LUMO or HOMO of the dot may provide the intermediate band.

FIG. 5 illustrates a cross-section of the device including an array spherical quantum dots. In practice, the actual shape of the dots depends upon the choice of fabrication technique. For example, inorganic quantum dots can be formed as semiconductor nanocrystallites in a colloidal solution, such as the "sol-gel" process known in the art. Even if the actual dots are not true spheres, spheres may nonetheless provide an accurate model.

For additional background on inorganic intermediate-band quantum dot devices and fabrication, see A. Marti et al., "Design constraints of quantum-dot intermediate band solar cell," Physica E 14, 150-157 (2002); A. Luque, et al., "Progress towards the practical implementation of the intermediate band solar cell," Conference Record of the Twenty-Ninth IEEE Photovoltaic Specialists Conference, 1190-1193 (2002); A. Marti et al., "Partial Filling of a Quantum Dot Intermediate Band for Solar Cells," IEEE Transactions on Electron Devices, 48, 2394-2399 (2001); Y. Ebiko et al., "Island Size Scaling in InAs/GaAs Self-Assembled Quantum Dots," Physical Review Letters 80, 2650-2653 (1998); and U.S. Pat. No. 6,583,436 B2 to Petroff et al. (Jun. 24, 2003); each of which is incorporated herein by reference for its description of state of the art.

Figure 6:
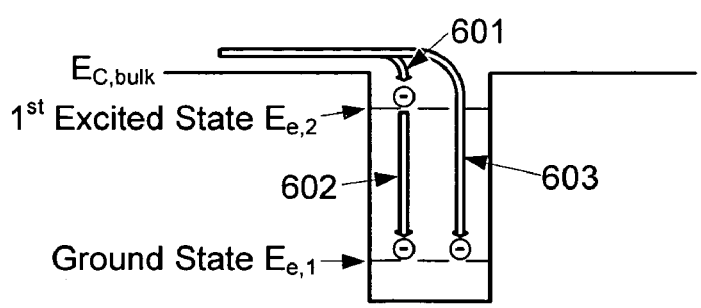
FIG. 6 is an energy band diagram for a cross-section of an inorganic quantum dot in an inorganic matrix material, illustrating de-excitation and trapping of a passing electron.
Figure 6:
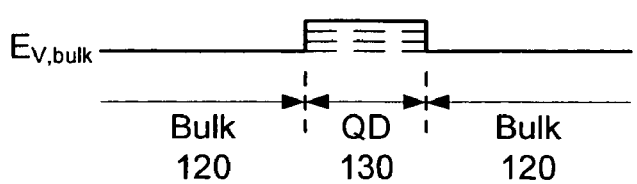

While formation of an intermediate band improves device performance, the results have failed to approach the expected theoretical improvement in photocurrent. One problem that has been identified is the trapping by the quantum dots of free carriers that would otherwise contribute to photocurrent. FIG. 6 illustrates a free electron being trapped by the quantum dot 130 when the charge carrier decays to an excited state $E_{e,2}$ (601) or to the ground state $E_{e,1}$ (602, 603). This de-excitation process reduces photocurrent as the energy is absorbed into the lattice as phonons. Similar carrier deexcitation and trapping also happens with holes. Accordingly, to improve the performance of intermediate-band solar cells, there is a need to reduce charge carrier de-excitation due to charge trapping.

A solution for reducing de-excitation trapping is to encapsulate each quantum dot in a thin barrier shell to require carriers to perform quantum mechanical tunneling to enter the dot. In classical mechanics, when an electron impinges a barrier of higher potential, it is completely confined by the potential "wall." In quantum mechanics, the electron can be represented by its wave function. The wave function does not terminate abruptly at a wall of finite potential height, and it can penetrate through the barrier. These same principles also apply to holes. The probability $T_t$ of an electron or hole tunneling though a barrier of finite height is not zero, and can be determined by solving the Schrödinger equation. In accordance with $T_t$, electrons or holes impinging a barrier simply reappear on the other side of the barrier. For additional background discussion on the phenomena of quantum mechanical tunneling and the Schrödinger equation, see the discussion below with FIGS. 19-22, as well as Robert F. Pierret, "Modular Series On Solid State Devices Volume VI, Advanced Semiconductor Fundamentals," *Chapter 2, Elements of Quantum Mechanics,* 25-51, Addison-Wesley Publishing (1989); and Kwok K. Ng, "Complete Guide to Semiconductor Devices," 2d ed., *Appendix B8, Tunneling,* 625-627, Wiley-Interscience (2002). These sections of Pierret and Ng are incorporated herein by reference for their background explanation.

FIG. 7 is a generalized cross-section of the array of quantum dots, each quantum dot modified to include a tunneling barrier 140. A quantum dot 130 and the tunneling barrier 140 around the quantum dot 130 may be materially and molecularly distinct from each other, or may be integrated as the core moiety and the shell of a single dendrimer molecule.

Figure 8A:
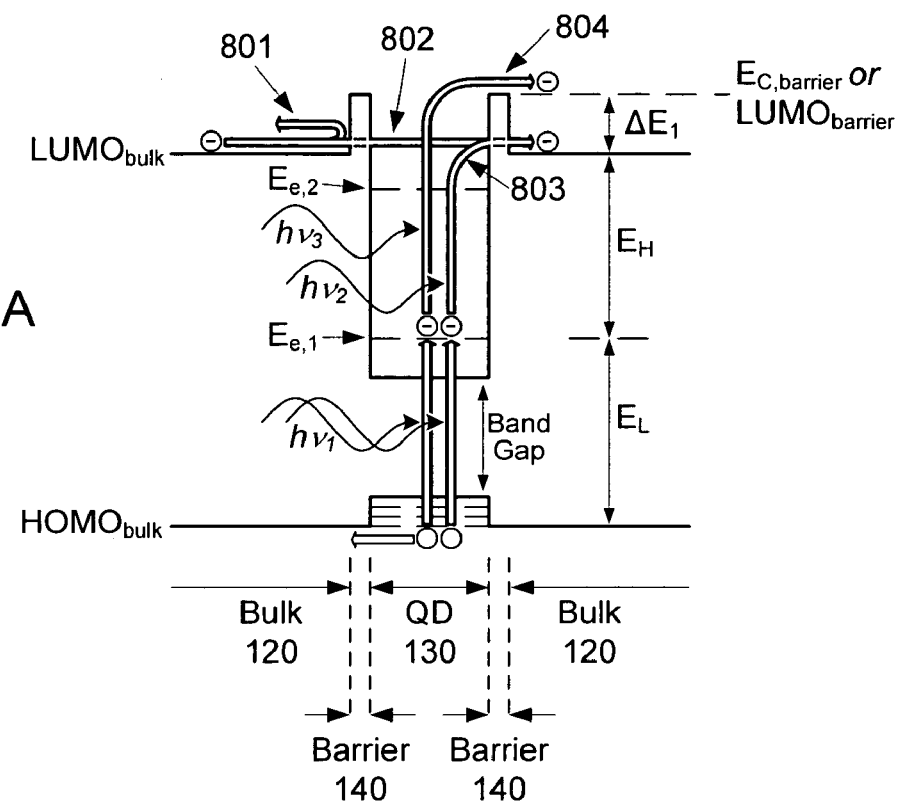
FIGS. 8A and 8B are energy band diagrams for a cross-section of an inorganic quantum dot embedded in an organic matrix material. The quantum dot includes a tunneling barrier like that shown in FIG. 7, with a lowest quantum state above the band gap providing the intermediate band.
Figure 8B:
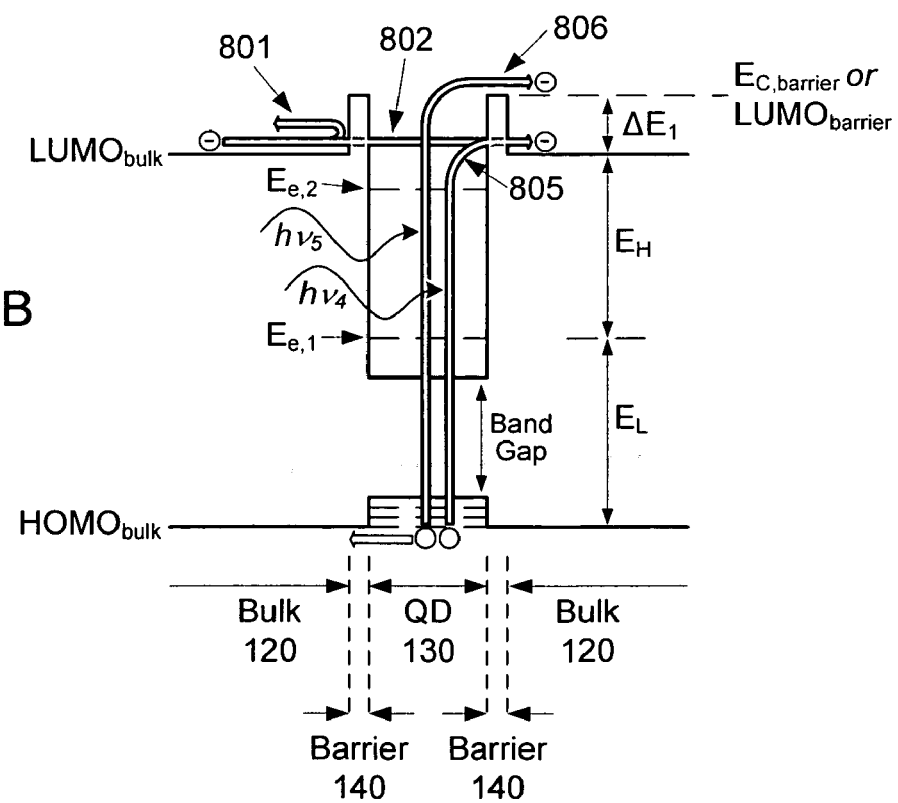

FIGS. 8A and 8B are energy band diagrams demonstrating an inorganic quantum dot 130 in an organic bulk matrix material 120. The quantum dot 130 has been modified to include a tunneling barrier 140 for electrons. With inorganic dots in an organic matrix, the tunneling barrier may be constructed from either inorganic or organic materials. A first quantum state above the band gap provides the intermediate band 280. Some free electrons will be repelled (801) by the tunneling barrier. Such electrons are still available to contribute to photocurrent. Some free electrons will tunnel through the tunneling barrier (802) into and then out of the dot.

If the barrier 140 is viewed in the abstract, the probability that a free electron will tunnel through it is the same from either side of the barrier. For example, if a barrier presents a tunneling probability ($T_t$) of 0.5, there is a 50% chance that an electron (having an energy E) impinging on the barrier will tunnel. However, the small area of confinement within the quantum dot itself results in a much higher likelihood that an individual electron will escape before the relaxation and/or de-excitation cause the electron to fall to a lower energy state, since an electron having the energy of $LUMO_{bulk}$ or higher is continually impinging upon the barrier due to spatial confinement.

Electrons below the band gap within the dot are excited into a first quantum state (e.g., $E_{e,1}$) providing the intermediate band by photons having energy h $v_1$. From the intermediate band, a photon having energy h $v_2$ may excite an electron to an energy where it will tunnel through (803) the tunneling barrier 140 to the $LUMO_{bulk}$ energy level of the bulk matrix material 120. In addition, a photon having an energy h $v_3$ may excite an electron over (804) the barrier 140. Electrons excited over the barrier have an excess energy of $\Delta E_1$. This excess energy $\Delta E_1$ is quickly lost as the electrons excited over the barrier decay to $LUMO_{bulk}$ energy level. This loss of excess energy is relatively minor, in comparison to the energy lost to trapping without the tunneling barriers 140, and in general, occurs before the electron can be trapped by an adjacent dot (i.e., entering an adjacent dot over, rather than through, the tunneling barrier 140).

A photon of energy h $v_4$ may excite an electron directly from the $HOMO_{bulk}$ energy level to an energy level where it tunnels through (805) the tunneling barrier 140 into the $LUMO_{bulk}$ energy level of the bulk matrix material 120. Further, a photon having an energy h $v_5$ may excite an electron directly from the $HOMO_{bulk}$ energy level over (806) the barrier 140.

In order to further minimize the probability that a free electron passing (802) into and out of the dot will experience deexcitation, it is preferred that a second quantum state (e.g., $E_{e,2}$) is substantially equal to the $LUMO_{bulk}$ energy level of the bulk material. Specifically, the second quantum state is preferably within ±5 kT of the $LUMO_{bulk}$ energy level (k being the Boltzmann contant and T being the operating temperature), thereby creating an overlap between the second quantum state and the $LUMO_{bulk}$ energy level. A free electron, if entering a dot at an energy corresponding to a forbidden level within the dot is statistically more likely to be trapped due to deexcitation; by positioning the second quantum state in the dot within ±5 kT of the $LUMO_{bulk}$ energy level, the probability of trapping decreases.

Operating temperatures for organic photosensitive devices are commonly specified as having a range of T=−40° C. to +100° C. Thus, using +100° C. as a maximum limit and solving for ±5 kT (i.e., 5×1.3806505E−23(J/K)/1.602E−19 (J/eV)×(T° C.+273.15) ° K.), the second quantum state should be within ±0.16 eV of the band gap edge of the bulk matrix material 120.

Figure 9:
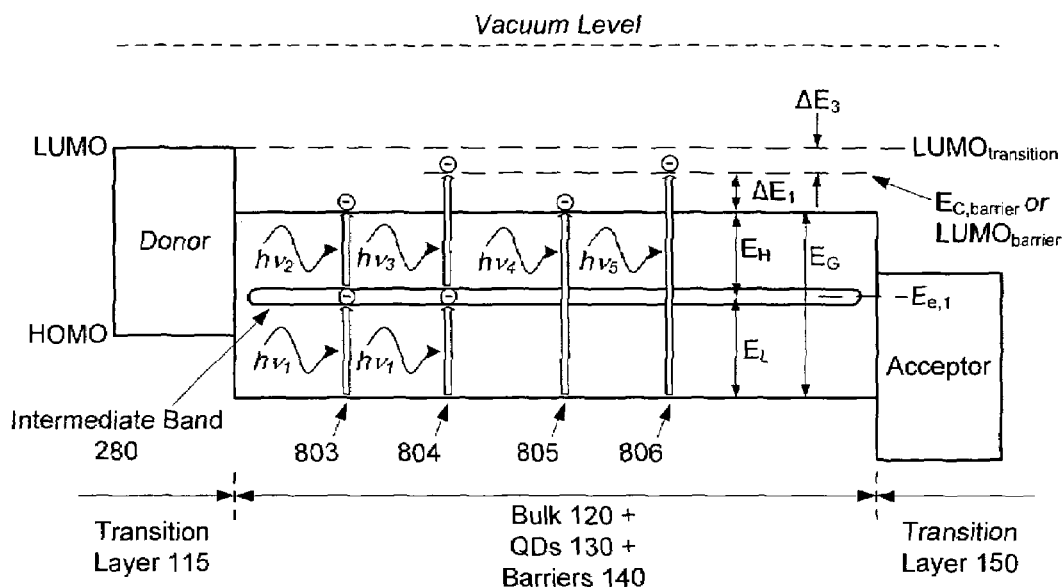
FIG. 9 is an energy band diagram for an intermediate-band solar cell based on the design in FIG. 1, including inorganic quantum dots as shown in FIGS. 8A and 8B.

FIG. 9 is an energy band diagram for a device using the quantum dots from FIGS. 8A and 8B. The transition layer 115 (donor) and transition layer 150 (acceptor) are arranged to create rectification, thereby controlling the direction of current flow, and to provide interfaces for electron-hole disassociation. The transition layers 115, 150 are preferably photoconductive, contributing to the photocurrent generated by the device. Depending up the relative proximity between the quantum dots and the transition layer 115 and the time it takes for an electron that escapes a dot over the barrier 140 (804 or 806) to decay to $LUMO_{bulk}$ energy level, it is possible that for some configurations, an electron that escapes a dot over the barrier 140 might have sufficient energy to create a reverse current flow into the transition layer 115. Therefore, depending upon proximity and decay times, consideration should be given to $\Delta E_3$, which is the difference between the LUMO of transition layer 115 and the peak of the tunneling barrier 140. To maintain rectification at the interface with the transition layer 1115, the LUMO of the transition layer 115 is preferably greater than a peak of the tunneling barriers. If the tunneling barrier 140 is organic, the peak is a $LUO_{barrier}$ peak. If the tunneling barrier 140 is inorganic, the peak is a conduction band edge ($E_{C,barrier}$) peak.

Figure 10A:
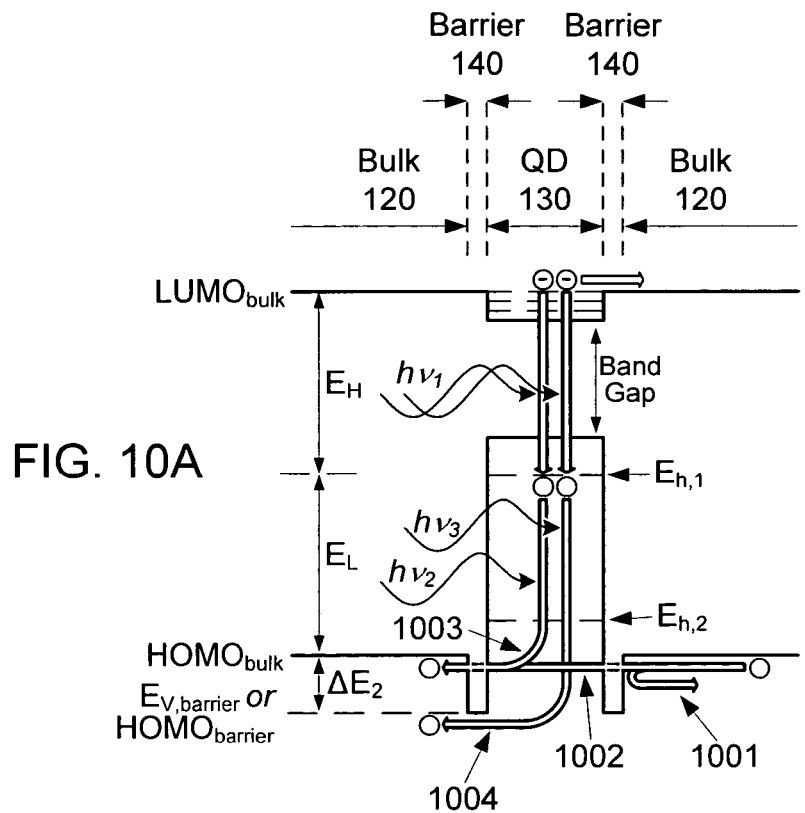
FIGS. 10A and 10B are energy band diagrams for a cross-section of an inorganic quantum dot embedded in an organic matrix material. The quantum dot includes a tunneling barrier like that shown in FIG. 7, with a highest quantum state below the band gap providing the intermediate band.
Figure 10B:
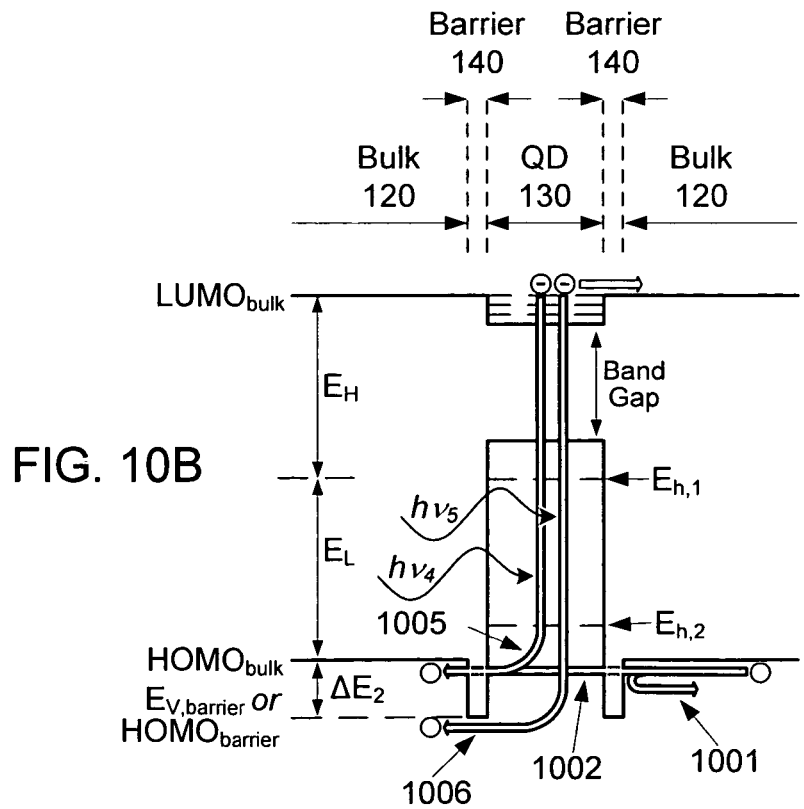

FIGS. 10A and 10B are energy band diagrams demonstrating an inorganic quantum dot 130 in an organic bulk matrix material 120. The quantum dot 130 has been modified to include a tunneling barrier 140 for holes. With inorganic dots in an organic matrix, the tunneling barrier may be constructed from either inorganic or organic materials. A first quantum state below the band gap provides the intermediate band 280. Some holes will be repelled (1001) by the tunneling barrier. Such holes are still available to contribute to photocurrent. Some holes will tunnel through the tunneling barrier (1002) into and then out of the dot.

As with the electron example discussed above with FIGS. 8A and 8B, the small area of confinement within the quantum dot itself results in a much higher likelihood that an individual hole will escape before the relaxation and/or de-excitation cause the hole to "fall" to a higher energy state, since a hole having the energy of $HOMO_{bulk}$ or lower is continually impinging upon the barrier due to spatial confinement.

Holes above the band gap within the dot are excited into a first quantum state (e.g., $E_{h,1}$), providing the intermediate band, by photons having energy h $v_1$. As with the concept discussed above with FIGS. 3A and 3B, excitation of hole in the LUMO is conceptually interchangeable with the generation of an electron-hole pair in the intermediate band, with the electron being excited into the LUMO and the hole being left behind in the intermediate band.

From the intermediate band, a photon having energy h $v_2$ may excite the hole to an energy where it will tunnel through (1003) the tunneling barrier 140 into the $HOMO_{bulk}$ energy level of the bulk matrix material 120. In addition, a photon having an energy h $v_3$ may excite a hole over (1004) the barrier 140 ("over" being used since holes fall up). Holes excited over the barrier have an excess energy of $\Delta E_2$. This excess energy $\Delta E_2$ is quickly lost as the holes excited over the barrier decay to the $HOMO_{bulk}$ energy level. This loss of excess energy is relatively minor, in comparison to the energy lost to trapping without the tunneling barriers 140, and in general, occurs before the hole can be trapped by an adjacent dot (i.e., entering an adjacent dot over, rather than through, the tunneling barrier 140).

A photon of energy h $v_4$ may excite a hole directly from the $LUMO_{bulk}$ energy level to an energy level where it tunnels through (1005) the tunneling barrier 140 into the $HOMO_{bulk}$ energy level of the bulk matrix material 120. Further, a photon having an energy h $v_5$ may excite a hole directly from the $LUMO_{bulk}$ energy level over (1006) the barrier 140.

In order to further minimize the probability that a hole passing (1002) into and out of the dot will experience deexcitation, it is preferred that a second quantum state (e.g., $E_{h,2}$) of the quantum dot is substantially equal to the $HOMO_{bulk}$ energy level of the bulk material. Specifically, the second quantum state should be within ±5 kT of the $HOMO_{bulk}$ energy level of the bulk material, thereby creating an overlap between the second quantum state and the $HOMO_{bulk}$ energy level. A hole, if entering a dot at an energy corresponding to a forbidden level within the dot is statistically more likely to be trapped due to deexcitation; by positioning the second quantum state in the dot within ±5 kT of the $HOMO_{bulk}$ energy level, the probability of trapping decreases.

Figure 11:
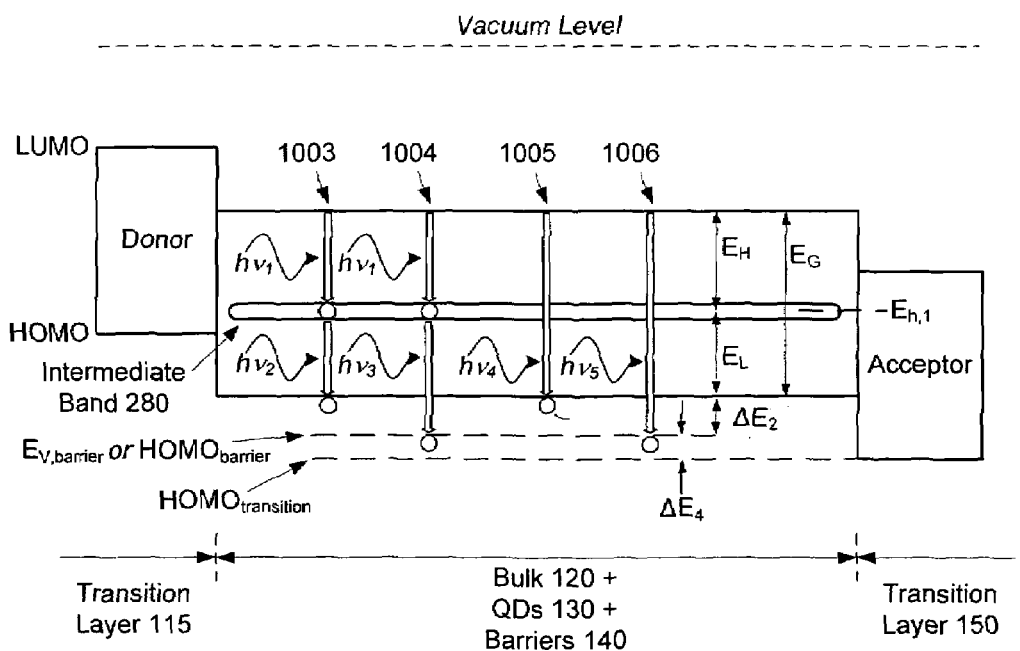
FIG. 11 is an energy band diagram for an intermediate-band solar cell based on the design in FIG. 1, including inorganic quantum dots as shown in FIGS. 10A and 10B.

FIG. 11 is an energy band diagram for a device using the quantum dots from FIGS. 10A and 10B. The transition layer 115 (donor) and transition layer 150 (acceptor) are again arranged to create rectification, thereby controlling the direction of current flow, and to provide interfaces for electron-hole disassociation. The transition layers 115, 150 are preferably photoconductive, contributing to the photocurrent generated by the device. Depending up the relative proximity between the quantum dots and the transition layer 150 and the time it takes for a hole that escapes a dot over the barrier 140 (1004 or 1006) to decay to $HOMO_{bulk}$ energy level, it is possible that for some configurations, a hole that escapes a dot over the barrier 140 might have sufficient energy to create a reverse current flow into the transition layer 150. Therefore, depending upon proximity and decay times, consideration should be given to $\Delta E_4$, which is the difference between the HOMO of transition layer 150 and the peak of the tunneling barrier 140. To maintain rectification at the interface with the transition layer 150, the edge of the HOMO of the transition layer is preferably lower than a peak of the tunneling barriers. If the tunneling barrier 140 is organic, the peak is a $HOMO_{barrier}$ peak. If the tunneling barrier is inorganic, the peak is a valence band edge ($E_{V,barrier}$) peak.

As used herein, the "peak" of a barrier for tunneling electrons is the highest energy edge of the barrier (i.e., maximum potential), whereas the "base" is commensurate with the energy level in the bulk matrix material at the interface with the barrier. The "peak" of a barrier for tunneling holes is the lowest energy edge of the barrier (i.e., minimum potential, relative to a energy band diagram), whereas the "base" is commensurate with the $HOMO_{bulk}$ energy level in the bulk matrix material at the interface with the barrier.

Carriers on organic molecules are tightly bound to molecular orbital, lacking the charge-cloud continuum characteristic of bulk inorganic materials. Organic molecules may have additional higher-order discrete quantized levels such as a LUMO+1, LUMO+2, HOMO−1, HOMO−2, etc. Unless a carrier escaping a dot 130 over the barrier 140 (i.e., 804, 806, 1004, 1006) is at an energy close to a higher-order orbital (e.g., HOMO−1, HOMO−2, LUMO+1, LUMO+2) of the organic bulk matrix 120, the carrier will transition toward the band gap into an allowed energy state. Preferably, to minimize over-the-barrier charge carrier trapping, the barrier 140 and bulk matrix 120 materials are selected to avoid having a higher-order orbital in the bulk matrix positioned within ±5 kT of the peak of the barrier.

A characteristic of inorganic quantum dots that bears explaining and is apparent in FIGS. 8A and 8B is that in an inorganic quantum dot, the $E_{e,1}$ quantum state may or may not correspond the conduction band edge (top of the band gap) of the quantum dot material. It is customary to illustrate the band gap of the dot material as though it were a bulk material, even if the band-gap edges of the material as arranged within the quantum dot are not "allowed" quantum states. The positions of allowed quantum states within an inorganic quantum dot are dependent on wave functions. As is known in the art, the position of the wave functions/quantum states can be engineered. As illustrated in FIGS. 8A and 8B, this may results in the $E_{e,1}$ quantum state being positioned away from the band gap edge. In other words, the band gap edge illustrated in an inorganic quantum dot may not necessarily be an allowed quantum state. These characteristics also apply to the valence-band side of inorganic quantum dots (i.e., $E_{h,1}$ in FIGS. 10A and 10B). This is different from the characteristics of organic quantum dots in which the HOMO and LUMO defining the band gap are always allowed states.

If the inorganic dots are formed conventionally as nanocrystals in a colloidal solution, an inorganic semiconductor or inorganic insulator to serve as tunneling barrier 140 may be added thereafter using, for example, the same colloidal methods, chemical vapor deposition (CVD), evaporation of the barrier material, or dipping the nanocrystals into a solution or oxidizing agent. If employing an organic semiconductor or organic insulator as tunneling barrier 140, the organic barrier may be added to the dots by, for example, organic vapor phase deposition (OVPD) or by dipping the dots into solution.

The array of barrier-coated inorganic dots and organic bulk matrix material may be deposited layer-by-layer, depositing the dots in each layer as a series of lines. The barrier-coated inorganic quantum dots may also be co-deposited in vacuum with the organic bulk matrix material, with the combination of the dots and the bulk matrix material forming a colloidal dispersion (a suspension). The organic bulk matrix material serves as the dispersion medium. An appropriate concentration of dots within the bulk matrix material may be selected, among other ways, by application of the Kronig-Penney Model.

Figure 12A:
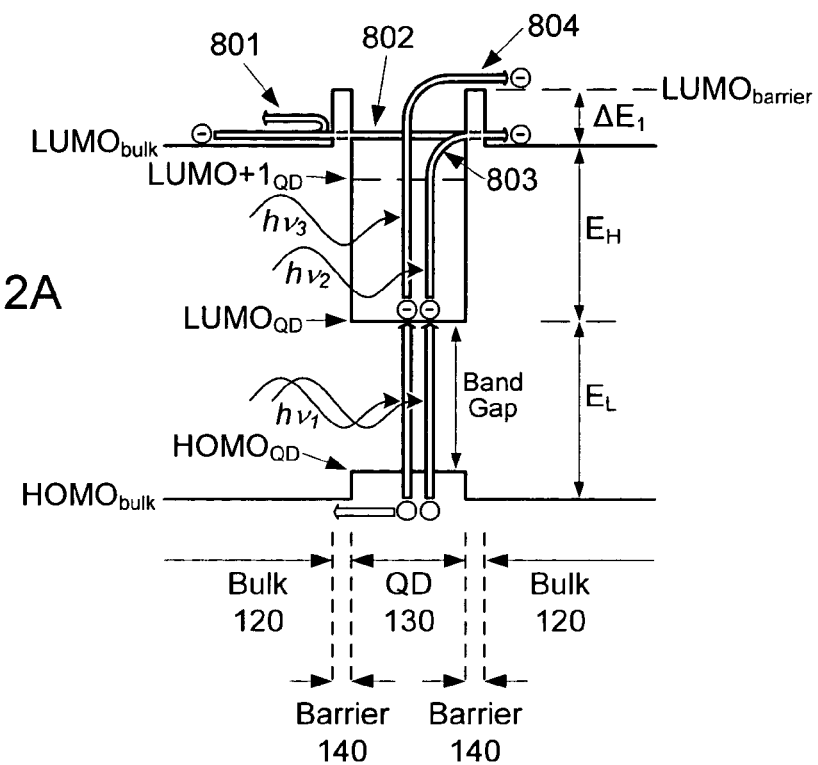
FIGS. 12A and 12B are energy band diagrams for a cross-section of an organic quantum dot embedded in an organic matrix material. The quantum dot includes a tunneling barrier like that shown in FIG. 7, with a lowest quantum state above the band gap providing the intermediate band.
Figure 12B:
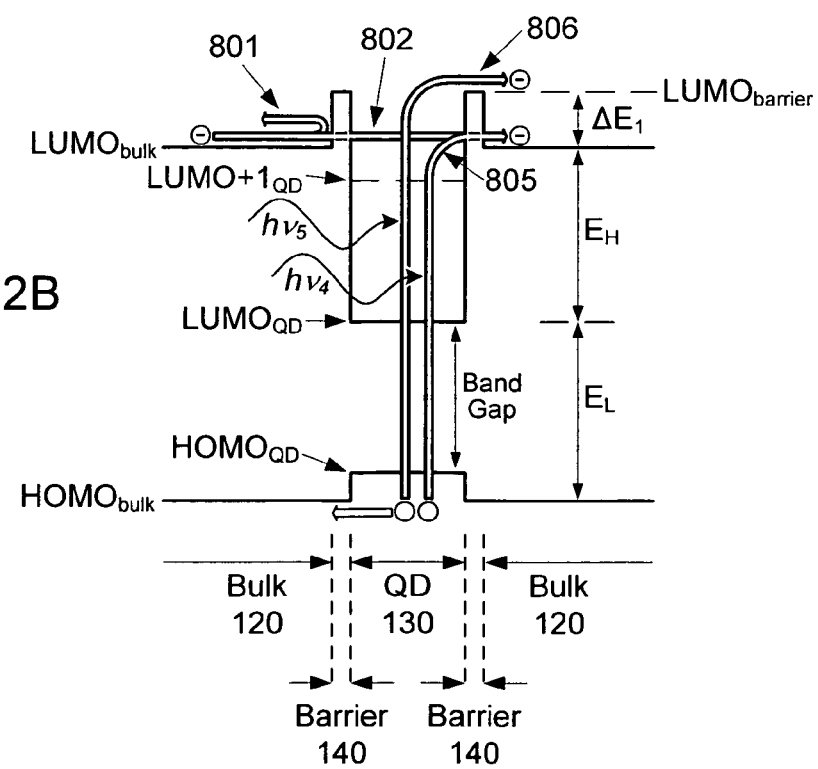
Figure 13A:
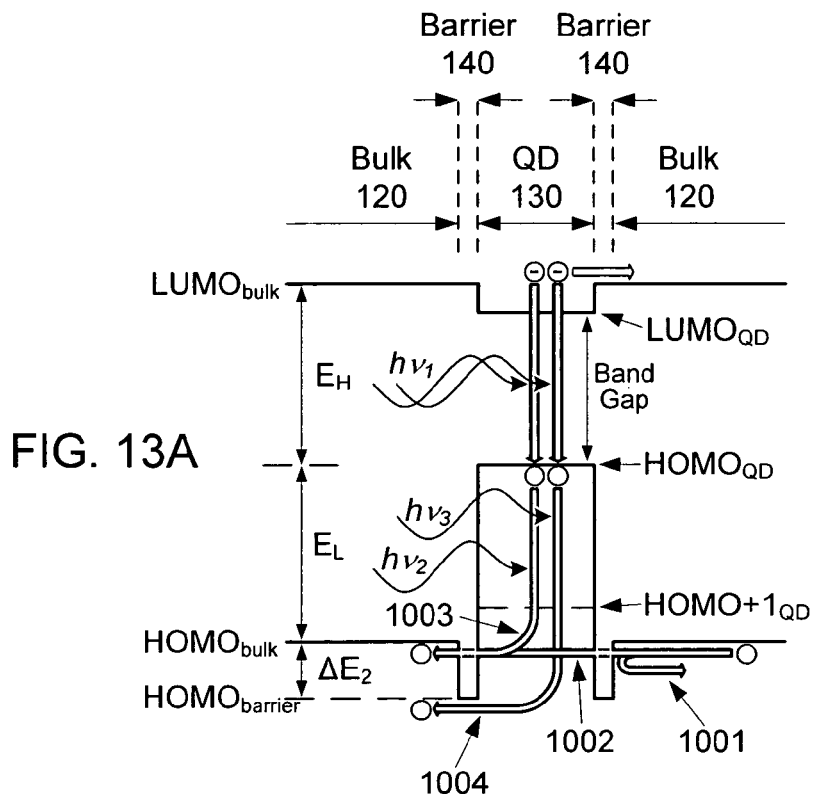
FIGS. 13A and 13B are energy band diagrams for a cross-section of an organic quantum dot embedded in an organic matrix material. The quantum dot includes a tunneling barrier like that shown in FIG. 7, with a highest quantum state below the band gap providing the intermediate band.
Figure 13B:
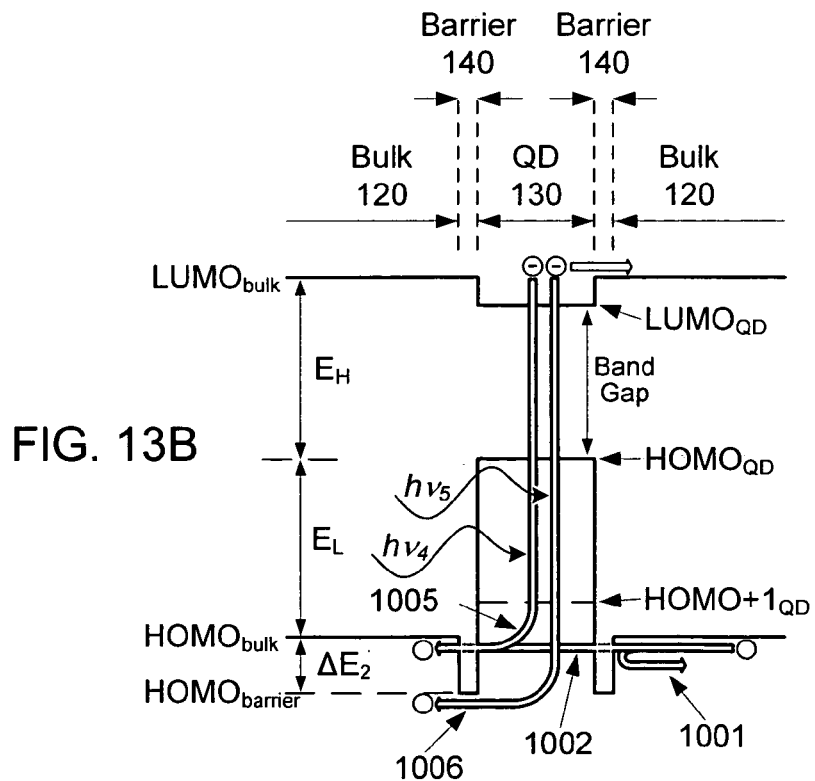

FIGS. 12A, 12B, 13A, and 13B are energy band diagrams for a cross-section of an organic quantum dot in an organic matrix material including an organic tunneling barrier. Energy transition, tunneling operations, and design considerations include those discussed above with FIGS. 8 and 10, respectively. Referring to FIGS. 12A and 12B, a first quantum state (i.e., as the intermediate band 280) is provided by $LUMO_{QD}$, and a second quantum state is provided by LUMO+n$_{QD}$, (n≧1). Referring to FIGS. 13A and 13B, a first quantum state (i.e., as the intermediate band 280) is provided by $HOMO_{QD}$, and a second quantum state is provided by HOMO−n$_{QD}$, (n≧1).

A feature that distinguishes a device having an organic quantum dots from a device having inorganic quantum dots is that the LUMO and HOMO states defining the band gap edges are always allowed energy states. In comparison, with inorganic dots, the $E_{e,1}$ and $E_{h,1}$ quantum states may or may not correspond to the band gap edge.

Each organic quantum dot 130 is preferably made of a small-molecule or dendrimer molecule photoconductive material, although any photoconductive organic material that can be coated with a tunneling barrier may be used (e.g., a polymer, such as a short-chain polymer). Each organic quantum dot may be one or more molecules, an preferably has a cross-sectional dimension on the order of the de Broglie wavelength of the relevant charge carrier (either hole or electron), which is typically on the order of hundreds of Ångstroms or less. As with the inorganic dots, the dots are preferably arranged so that wave functions between dots overlap to form a miniband.

An organic tunneling barrier 140 may be added to organic quantum dots 130 by, for example, organic vapor phase deposition (OVPD) or by dipping the dots into solution. The tunneling barrier 140 may also be formed as a shell of dendrimer, the core moiety of the dendrimer serving as the quantum dot 130.

The array of barrier-coated organic dots and organic bulk matrix material may be deposited layer-by-layer, depositing the dots in each layer as a series of lines. The barrier-coated organic dots may also be co-deposited in vacuum with the organic bulk matrix material, with the combination of the dots and the bulk matrix material forming a colloidal dispersion (a suspension). The bulk matrix material serves as the dispersion medium. An appropriate concentration of dots within the bulk matrix material may be selected, among other ways, by application of the Kronig-Penney Model.

Figure 14:
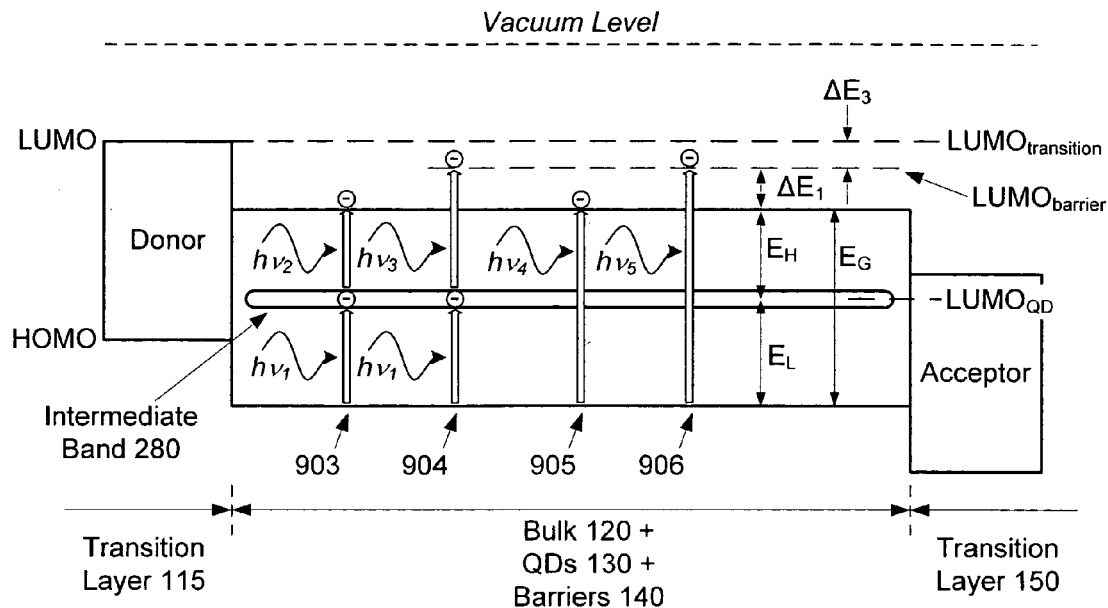
FIG. 14 is an energy band diagram for an intermediate-band solar cell based on the design in FIG. 1, including organic quantum organic dots as shown in FIGS. 12A and 12B.
Figure 15:
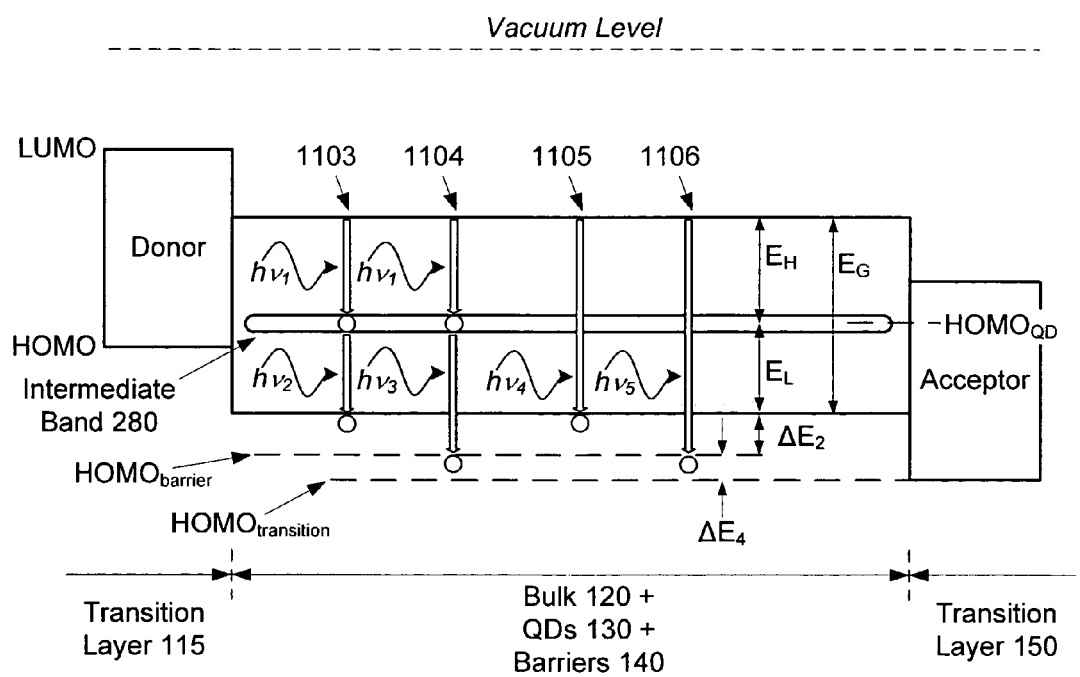
FIG. 15 is an energy band diagram for an intermediate-band solar cell based on the design in FIG. 1, including organic quantum organic dots as shown in FIGS. 13A and 13B.

FIG. 14 is an energy band diagram for a device using the quantum dots from FIGS. 12A and 12B. FIG. 15 is an energy band diagram for a device using the quantum dots from FIGS. 13A and 13B. Design considerations include those discussed above with FIGS. 9 and 11, respectively.

Figure 16:
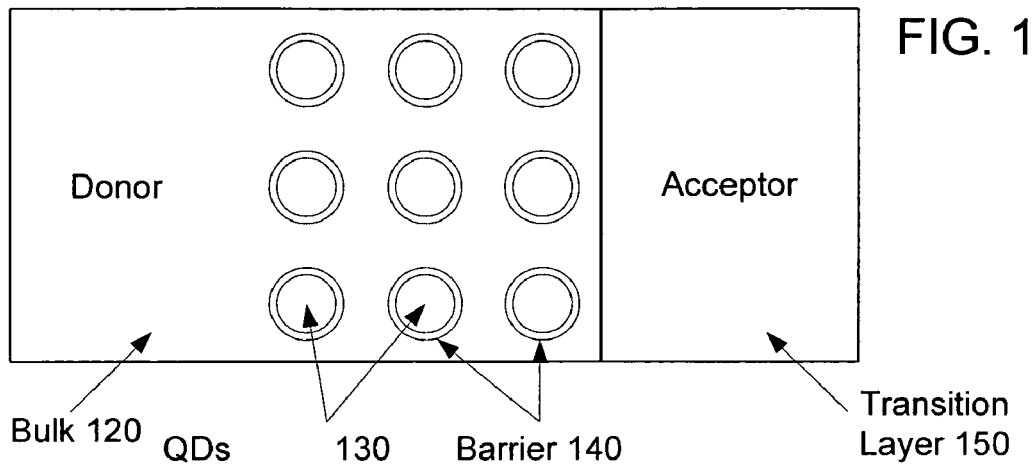
FIGS. 16-18 illustrate additional examples of cross-sectional arrangements of the quantum dots having tunneling barriers in organic matrices.
Figure 17:
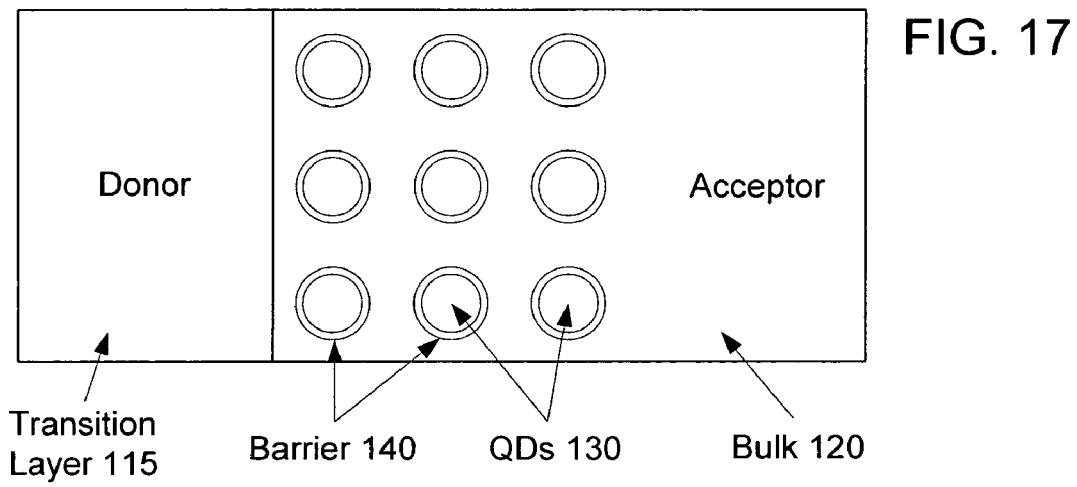
Figure 18:
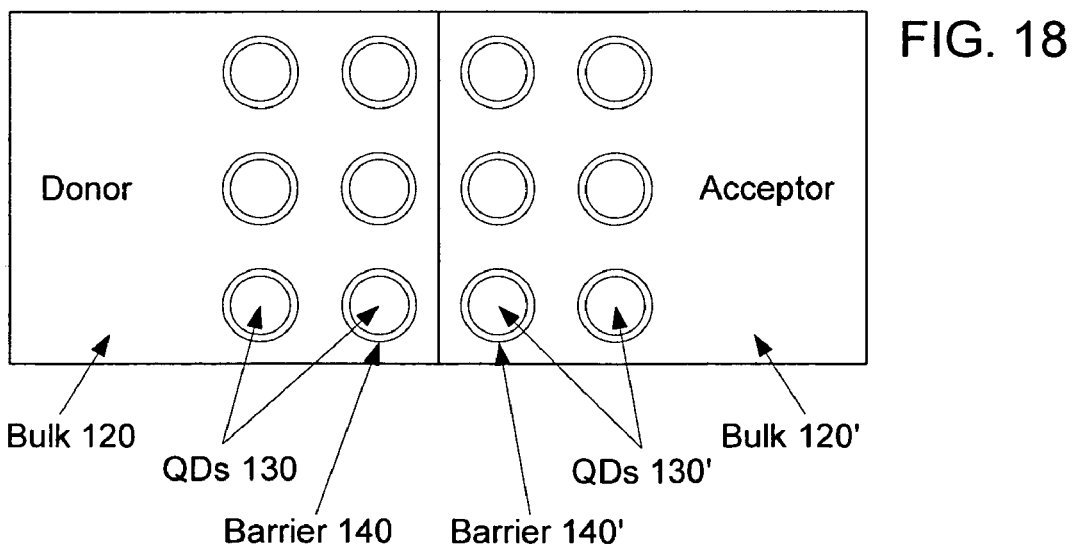

FIGS. 16-18 illustrate additional examples of cross-sectional arrangements of the quantum dots 130 having the tunneling barriers 140 in organic matrices. As in the other examples, the quantum dots may be either organic or inorganic.

FIG. 16 illustrates a donor-acceptor heterojunction in which the bulk matrix 120 is arranged as the donor layer. FIG. 17 illustrates a donor-acceptor heterojunction in which the bulk matrix 120 is arranged as the acceptor layer.

FIG. 18 illustrates a donor-acceptor heterojunction formed by two different bulk matrices. The first bulk matrix 120 is arranged as the donor, and the second bulk matrix 120' is arranged as the acceptor. The quantum dot 130, 130' in the two bulk matrices may be made of a same material, or different materials. Likewise, one set of dot barriers 140, 140' may be arranged for hole tunneling, and the other may be arranged for electron tunneling, or the dots and dot barriers on both sides of the donor-acceptor interface may be arranged for a same type of tunneling. The energy level of the intermediate band 280 on each side of the donor-acceptor interface may be different, and the incident photon energies required to pump a charge carrier across the band gap of the respective bulk matrix via the dots (i.e., through the intermediate band) may also be different.

As described above, for any of the organic quantum dots 130, examples of organic semiconductor materials that can make up the dots include a photoconductive small molecule, a photoconductive dendrimer molecule, and photoconductive polymer.

For any of the inorganic quantum dots 130, examples of inorganic photoconductive semiconductor materials that can make up the dots include III-V compound semiconductors such as AlAs, AlSb, AlP, AlN, GaAs, GaSb, GaP, GaN, InAs, InSb, InP, and InN; II-VI compound semiconductors such as CdS, CdSe, CdTe, ZnO, ZnS, ZnSe, and ZnTe; other compound semiconductors such as PbS, PbSe, PbTe, and SiC; and the ternary and quaternary alloys of such compound semiconductors.

For any of the inorganic tunneling barriers 140, examples of materials that can form the barriers include the aforementioned inorganic semiconductor materials, as well as insulators such as oxides, nitrides, or oxynitrides. How to select materials having appropriate relative energies are well known in the art, and are not addressed here.

For any of the organic tunneling barriers 140 used with either organic or inorganic quantum dots, examples of materials that can form the barriers include polymers, thiols, dendrimers, alkane chains, and organic oxides.

If a dendrimer is used as the quantum dots, both the quantum dot 130 and the barrier layer 140 can be integrated as a single dendrimer molecule. Specifically, the core moiety of the dendrimer serves as the quantum dot 130 and the shell of the dendrimer serves as the barrier layer 140. In the alternative, an entirety of a dendrimer molecule can be used as a quantum dot 130 with a separate coating as the barrier layer 140 (i.e., a coating of a polymer, thiol, alkane chain, organic oxide, or different dendrimer).

For any of the organic bulk matrix materials 120, examples of materials that can form the organic matrix include polymer and small molecule photoconductive materials.

FIGS. 19-22 further demonstrate the principles of quantum mechanical tunneling. The explanation and equations below are based upon a discussion in "Complete Guide to Semiconductor Devices," 2d ed., by Kwok K. Ng, *Appendix B8, Tunneling*, 625-627, Wiley-Interscience (2002). The explanation and equations have been modified to, among other things, accommodate holes in addition to electrons. Also, although the effective mass of a charge carrier in the quantum dot material and in the barrier material does not usually change significantly, the equations are modified to use a reduced effective mass adjusted for the change.

Figure 19:
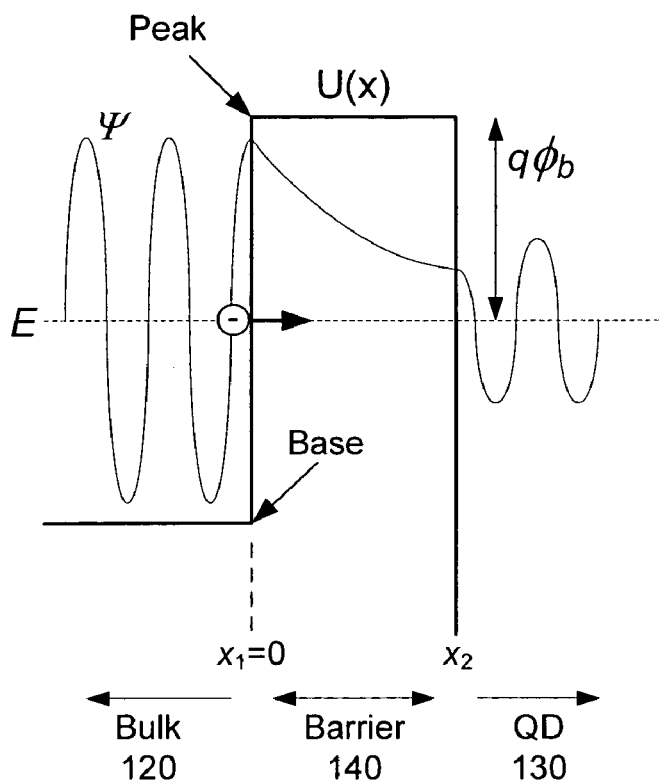
FIGS. 19 and 20 demonstrate tunneling through a rectangular barrier.

In general, without regard to whether organic and/or inorganic materials are used to build the photosensitive device, if the energy level E of a carrier relative to the barrier height is known, three parameters are required to determine the tunneling probability $T_t$ for the carrier: the absolute value of the difference between the peak of the tunneling barrier and the energy of the carrier ($\phi_b$), the thickness ($\Delta x$) of the barrier at the energy level of the carrier, and the potential profile U(x) of the barrier. The potential profile U(x) of the barrier is sometimes referred to as the "shape" of the barrier. An example of an electron tunneling through a rectangular barrier is illustrated in FIG. 19.

As is known in the art, to calculate the tunneling probability $T_t$ for an electron, the wave function $\Psi$ has to be determined from the Schrödinger equation:

$$\frac{d^2\Psi}{dx^2} + \frac{2m_r^*}{\hbar^2}[E - U(x)]\Psi = 0 \qquad (1)$$

where $m_r^*$ is the reduced effective mass of the charge carrier (in this case, an electron), h is the reduced Planck constant, and q is electron charge.

The reduced effective mass of the charge carrier is:

$$\frac{1}{m_r^*} = \frac{1}{m_{QD}^*} + \frac{1}{m_{barrier}^*} \qquad (2)$$

where $m_{QD}^*$ is the effective mass of the charge carrier in the quantum dot, and $M_{barrier}^*$ is the effective mass of the charge carrier in the barrier material.

Since the potential profile U(x) of the barrier does not vary rapidly, Equation (1) can be simplified using the Wentzel-Kramers-Brillouin approximation and integrated to determine the wave function:

$$\left|\frac{\Psi(x_2)}{\Psi(x_1)}\right| = \exp\left\{-\int_{x_1}^{x_2} \sqrt{\frac{2m_r^*}{\hbar^2}[U(x)-E]}\, dx\right\} \quad (3)$$

Since the probability of the electron's presence is proportional to the square of the wave function magnitude, the tunneling probability $T_t$ is given by:

$$T_t = \left|\frac{\Psi(x_2)}{\Psi(x_1)}\right|^2 = \exp\left\{-2\int_{x_1}^{x_2} \sqrt{\frac{2m_r^*}{\hbar^2}[U(x)-E]}\, dx\right\} \quad (4)$$

For the case of the rectangular barrier illustrated in FIG. 19, solving Equation (4) for the tunneling probability is given by:

$$T_t = \exp\left\{-2\sqrt{\frac{2m_r^* q \phi_b}{\hbar^2}}\Delta x\right\} \quad (5)$$

Figure 20:
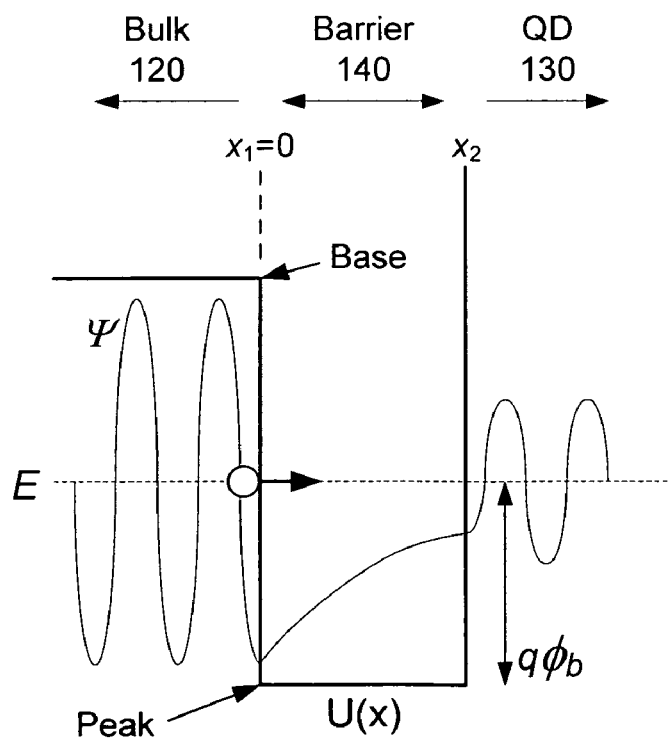

Adapting Equation (5) to also apply to hole tunneling, as illustrated in FIG. 20 (in addition to electron tunneling illustrated in FIG. 19) by taking the absolute value of $\phi_b$, and then rearranging the equation to solve for the thickness ($\Delta x$) of the barrier at the energy level of the carrier gives:

$$\Delta x = \frac{-\ln(T_t)\hbar}{2\sqrt{2m_r^* q |\phi_b|}} \quad (6)$$

where $m_r^*$ is the reduced effective mass of the charge carrier (electron or hole).

From a design point-of-view, the thickness $\Delta x$ of the barrier is preferably selected based on the energy level at the base of the tunneling barrier. In an organic bulk matrix 120, the quantized nature of the HOMO and LUMO levels makes it a near certainty that electrons reaching the barrier 140 will have the energy level at the base. (An exception might be carriers that go over the barrier, if there is an intervening HOMO−1 or LUMO+1 that could delay deexcitation to the base level; however, even if this were to occur, carriers having the base energy would still dominate).

If the energy E of the charge carrier equals the energy level at the base of the tunneling barrier, then $|\phi_b|$ equals the absolute value of the height of the barrier, which is the difference between the energy levels at the peak and the base of the tunneling barrier. These energy levels are physical characteristic of the materials used for the bulk matrix material 120 and the barrier material 140. For example, in FIG. 19, the barrier height equals the LUMO (organic) or conduction band edge $E_C$ (inorganic) of the barrier material minus the LUMO of the bulk matrix material; in FIG. 20, the barrier height equals the HOMO (organic) or valence band edge $E_V$ (organic) of the barrier material minus the HOMO of the bulk matrix material. The effective mass of the charge carrier in the barrier material $m_{barrier}^*$ and in the quantum dot material $m_{QD}^*$ are also physical characteristics of the respective materials. Moreover, the thickness $\Delta x$ at the base of the tunneling barrier equals the physical thickness of the tunneling barrier layer 140.

For example, if electrons tunnel through an inorganic barrier and approximating E as the energy level at the base of the barrier, Equation (6) can be expressed as:

$$\Delta x = \frac{-\ln(T_t)\hbar}{2\sqrt{2m_r^* q |E_{C,barrier} - LUMO_{bulk}|}} \quad (6a)$$

If electrons tunnel through an organic barrier and approximating E as the energy level at the base of the barrier, Equation (6) can be expressed as:

$$\Delta x = \frac{-\ln(T_t)\hbar}{2\sqrt{2m_r^* q |LUMO_{barrier} - LUMO_{bulk}|}} \quad (6b)$$

If holes tunnel through an inorganic barrier and approximating E as the energy level at the base of the barrier, Equation (6) can be expressed as:

$$\Delta x = \frac{-\ln(T_t)\hbar}{2\sqrt{2m_r^* q |E_{V,barrier} - HOMO_{bulk}|}} \quad (6c)$$

If holes tunnel through an organic barrier and approximating E as the energy level at the base of the barrier, Equation (6) can be expressed as:

$$\Delta x = \frac{-\ln(T_t)\hbar}{2\sqrt{2m_r^* q |HOMO_{barrier} - HOMO_{bulk}|}} \quad (6d)$$

Thus, if the materials are known, the preferred thickness $\Delta x$ of the barrier layer 140 can be determined for any tunneling probability $T_t$.

Absent substantial diffusion or other material intermixing at the boundaries of the tunneling barrier 140, the potential profile U(x) of the tunneling barrier can almost always be approximated as rectangular. Furthermore, for any combination of materials, the thickness needed for the barrier layer is directly proportional to the negative of the natural log of the tunneling probability in accordance with:

$$\Delta x \propto \frac{-\ln(T_t)\hbar}{\sqrt{2m_r^* q |\phi_b|}} \quad (7)$$

An equation to calculate barrier thickness can be derived for any function U(x). Without regard to the potential profile U(x) of the tunneling barrier, Equation (7) holds true. For example, FIG. 21 illustrates a triangular barrier and FIG. 19 illustrates a parabolic barrier.

Figure 21:
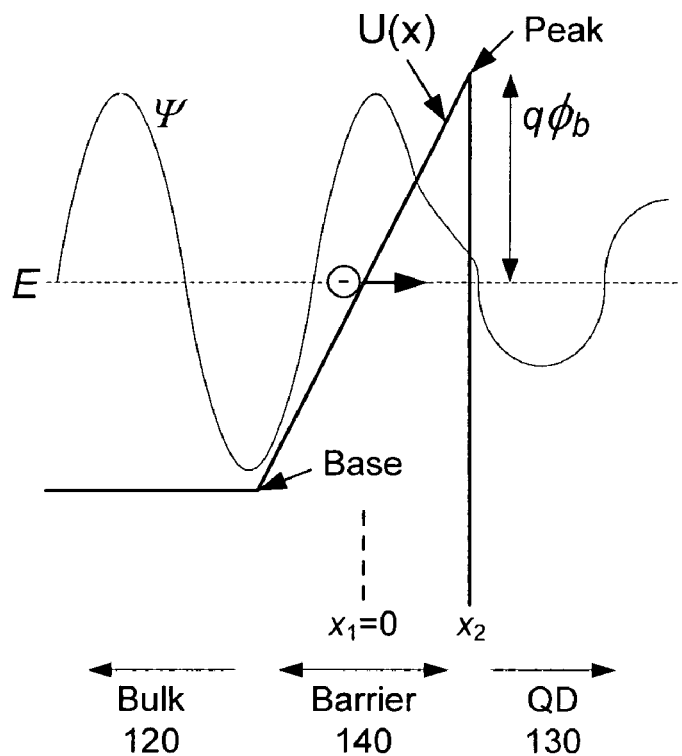
FIG. 21 demonstrates a triangular tunneling barrier.
Figure 22:
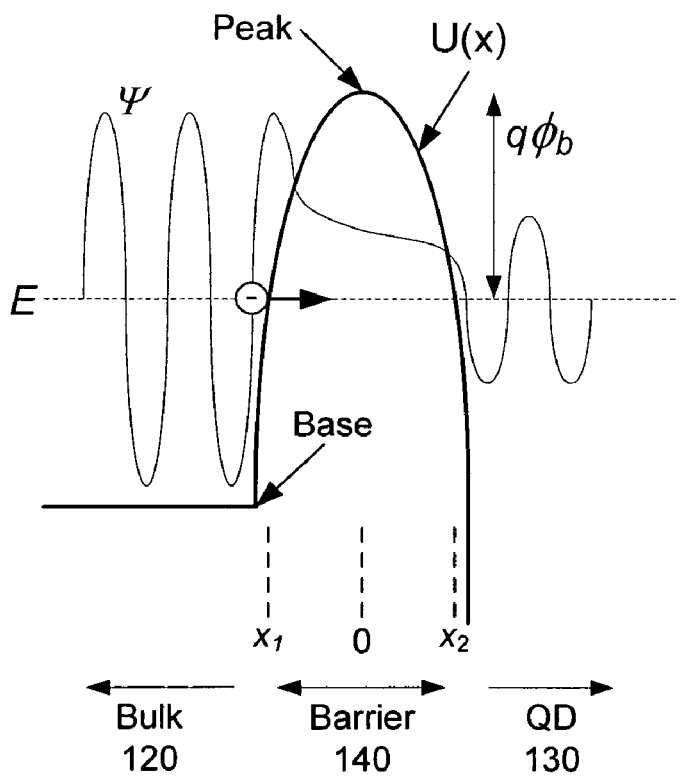
FIG. 22 demonstrates a parabolic tunneling barrier.

In FIG. 21, potential can be described by:

$$U(x) - E = q\phi_b\left(\frac{x}{\Delta x}\right) \quad (8)$$

Solving Equation (4) with Equation (8), the tunneling probability is given by:

$$T_t = \exp\left\{-\frac{4}{3}\sqrt{\frac{2m_r^* q \phi_b}{\hbar^2}} \Delta x\right\} \quad (9)$$

Adapting Equation (9) to also apply to hole tunneling by taking the absolute value of $\phi_b$, and then rearranging the equation to solve for the thickness ($\Delta x$) of the barrier at the energy level of the carrier gives:

$$\Delta x = \frac{-3\ln(T_t)\hbar}{4\sqrt{2m_r^* q |\phi_b|}} \quad (10)$$

In FIG. 19 potential can be described by:

$$U(x) - E = q\phi_b\left(1 - \frac{4x^2}{\Delta x^2}\right) \quad (11)$$

Solving Equation (4) with Equation (10), the tunneling probability is given by:

$$T_t = \exp\left\{-\frac{\pi}{2}\sqrt{\frac{2m_r^* q \phi_b}{\hbar^2}} \Delta x\right\} \quad (12)$$

Adapting Equation (12) to also apply to hole tunneling by taking the absolute value of $\phi_b$, and then rearranging the equation to solve for the thickness ($\Delta x$) of the barrier at the energy level of the carrier gives:

$$\Delta x = \frac{-2\ln(T_t)\hbar}{\pi\sqrt{2m_r^* q |\phi_b|}} \quad (13)$$

Thus, Equation (7) holds true, without regard to the potential profile U(x) of the barrier.

The tunneling probability $T_t$ for barrier 140 is preferably between 0.1 and 0.9. A more precise probability $T_t$ may be determined experimentally for any design by measuring the photocurrent output, thereby determining the efficiency to be gained. The more preferred range for $T_t$ is between 0.2 and 0.5.

There is a balance to be struck between barrier height and barrier thickness for any given tunneling probability $T_t$. It may seem that making the barrier lower would increase efficiency by lessening the energy lost to deexcitation of carriers that hop out of a dot over the barrier, rather than tunneling out. However, this introduces another inefficiency since the barrier layer would need to be thicker for a same tunneling probability $T_t$, reducing the volume-percentage of the device dedicated to generating photocurrent. Even if the barriers are made of photoconductive materials, they would not be expected to appreciably contribute to photocurrent generation (due to their relatively large band gap). The end result is that thicker barriers take up space that would otherwise be composed of photoconductive materials, lowering photocurrent generation and efficiency. Accordingly, the preferred thickness limit for a tunneling barrier is between 0.1 to 10 nanometers. Within the range of 0.1 to 10 nanometers, the thickness of the tunneling barrier is preferably no more than 10% of the average cross-sectional thickness of a quantum dot, through a center of a quantum dot.

Whether holes or electrons are being used as the tunneling charge carrier, it is generally preferable that the energy levels of the opposite side of the band gap not create a trap for the opposite carrier. For example, referring to FIGS. 8A, 8B, 12A, and 12B, the $E_{V,barrier}$ (inorganic) or $HOMO_{barrier}$ (organic) of the barrier layer 140 is preferably within ±5 kT of the $HOMO_{bulk}$ of the bulk matrix 120. This general ±5 kT difference is also preferred between the $LUMO_{bulk}$ and the $E_{C,barrier}$ (inorganic) or $LUMO_{barrier}$ (organic) on the opposite side of the quantum dots in FIGS. 10A, 10B, 13A, and 13B. The quantum dot material may be chosen to minimize the depth of the potential "trap" for the opposite carrier. Additionally, an energy state within the potential "trap" for the opposite side of the band gap is preferably positioned to keep an outermost quantum state within the trap within ±5 kT of the energy levels of the adjacent barrier layers 140, somewhat improving the probability that a passing electron or hole will pass right by without deexcitation.

The number of energy levels shown in the drawings within the quantum dots are simply examples. On the tunneling side, while there are preferably at least two quantum states (one forming the intermediate band and one positioned to overlap the energy level of the adjacent bulk matrix material), there may only be a single quantum state providing the intermediate band. Likewise, although the intermediate band is preferably formed by the quantum states closest to the band gap, a higher order energy state could be used. So long as the wave functions between adjacent dots overlap, a deciding factor as to whether a quantum state can function as an intermediate band is whether the two wavelengths required to pump a carrier by $E_L$ and $E_H$ will be incident on the dots.

As a practical matter, a band cannot function as an intermediate band if two wavelengths needed to pump the carrier though the band will never be incident on the quantum dots. For example, if one of the wavelengths needed for pumping $E_L$ or $E_H$ is absorbed by the bulk matrix material, the barrier material, etc., it will not be incident on the quantum dots, even if the wavelength is incident on the photosensitive device itself. For many materials, this same problem limits the practicality of inter-band pumping through two quantum states (e.g., pumping from the valence band to an $E_{e,1}$ state, then to an $E_{e,2}$ state, and then into the conduction band). In any case, the tunneling barrier 140 and bulk matrix material 120 need to be substantially transparent to photons having energy $E_L$ and $E_H$. Another consideration to balance when selecting materials is the efficiency and contribution to photocurrent of the transition of carriers directly across the bulk matrix band gap $E_G$ (without passing into the intermediate band) in both the bulk matrix 120 and in the dots 130 themselves.

Although the coated quantum dots are preferably arranged to form minibands, a distribution that does not create overlap between wavefunctions may nonetheless improve the quantum efficiency of the device. Moreover, a plurality of different types of coated quantum dots may be used within a device to broaden responsively to a wider range of energies. For example, a first type of quantum dot may be responsive to photons having energies $E_{L1}$ and $E_{H1}$, and a second type of quantum dot may be responsive to photons having energies $E_{L2}$ and $E_{H2}$, wherein $E_{L1}$, $E_{H1}$, $E_{L2}$, and $E_{H2}$ are all different.

As described above, organic photosensitive devices of the present invention may be used to generate electrical power from incident electromagnetic radiation (e.g., photovoltaic devices). The device may be used to detect incident electromagnetic radiation (e.g., a photodetector or photoconductor cell). If used as a photoconductor cell, the transition layers 115 an 150 may be omitted.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A photosensitive device comprising:
   a plurality of quantum dots, each quantum dot having a shell; and
   an organic matrix, the quantum dots being embedded in the organic matrix,
   at least the quantum dots and the organic matrix being photoconductive semiconductors,
   the shell around each quantum dot being arranged as a tunneling barrier to require an electron in a lowest unoccupied molecular orbital (LUMO) of the organic matrix to perform quantum mechanical tunneling to reach the respective quantum dot, and
   a first quantum state above the band gap in each quantum dot being between the LUMO and a highest occupied molecular orbital (HOMO) of the organic matrix, wave functions of the first quantum state of the plurality of quantum dots to overlap as an intermediate band.

2. The photosensitive device of claim 1, each quantum dot further having a second quantum state, wherein the second quantum state is above the first quantum state and within ±0.16 eV of the LUMO of the organic matrix.

3. The photosensitive device of claim 1, a height of the tunneling barrier being an absolute value of an energy level difference between a peak of the tunneling barrier and the LUMO of the organic matrix,
   wherein a combination of the height and potential profile of the tunneling barrier and a thickness of the shell around each quantum dot corresponds to a tunneling probability between 0.1 and 0.9 that the electron will tunnel into the respective quantum dot from the organic matrix.

4. The photosensitive device of claim 3, wherein for each quantum dot, the thickness of the shell is in a range of 0.1 to 10 nanometers.

5. The photosensitive device of claim 3, wherein the combination of the height and potential profile of the tunneling barrier and the thickness of the shell around each quantum dot corresponds to a tunneling probability between 0.2 and 0.5 that the electron will tunnel into the respective quantum dot from the organic matrix.

6. The photosensitive device of claim 5, wherein for each quantum dot, the thickness of the shell is in a range of 0.1 to 10 nanometers.

7. The photosensitive device of claim 1, wherein the organic matrix is composed of a photoconductive small molecule semiconductor.

8. The photosensitive device of claim 1, wherein the organic matrix is composed of a photoconductive polymer semiconductor.

9. The photosensitive device of claim 1, wherein each quantum dot is composed of an inorganic semiconductor.

10. The photosensitive device of claim 9, wherein each quantum dot is composed of a compound semiconductor selected from the group consisting of III-V compound semiconductors, II-VI compound semiconductors, PbS, PbSe, PbTe, SiC, and ternary and quaternary alloys thereof.

11. The photosensitive device of claim 9, wherein the shell around each quantum dot is composed of an inorganic semiconductor or an inorganic electrical insulator.

12. The photosensitive device of claim 11, wherein the shell around each quantum dot is composed of a compound semiconductor selected from the group consisting of III-V compound semiconductors, II-VI compound semiconductors, PbS, PbSe, PbTe, SiC, and ternary and quaternary alloys thereof.

13. The photosensitive device of claim 11, wherein the shell around each quantum dot is composed of an inorganic electrical insulator selected from the group consisting of oxides, nitrides, and oxynitrides.

14. The photosensitive device of claim 9, wherein the shell around each quantum dot is composed of an organic semiconductor or an organic electrical insulator.

15. The photosensitive device of claim 14, wherein the shell around each quantum dot is composed of an organic material selected from the group consisting of polymers, thiols, dendrimers, alkane chains, and organic oxides.

16. The photosensitive device of claim 9, further comprising an organic donor layer and an organic acceptor layer in superposed relationship, the quantum dots embedded in the organic matrix being disposed between the donor layer and the acceptor layer, wherein a lowest unoccupied molecular orbital (LUMO) of the donor layer is higher than a peak of the tunneling barriers provided by the shells around the quantum dots.

17. The photosensitive device of claim 1, wherein:
   each quantum dot is composed of an organic semiconductor, and
   the shell around each quantum dot is composed of an organic semiconductor or an organic electrical insulator.

18. The photosensitive device of claim 17, wherein:
   each quantum dot is composed of a first organic material selected from the group consisting of a photoconductive small molecule, a photoconductive dendrimer molecule, and a photoconductive polymer molecule; and
   the shell around each quantum dot is composed of a second organic material selected from the group consisting of polymers, thiols, dendrimers, alkane chains, and organic oxides.

19. The photosensitive device of claim 17, further comprising an organic donor layer and an organic acceptor layer in superposed relationship, the quantum dots embedded in the organic matrix being disposed between the donor layer and the acceptor layer, wherein a lowest unoccupied molecular orbital (LUMO) of the donor layer is higher than a peak of the tunneling barriers provided by the shells around the quantum dots.

20. The photosensitive device of claim 1, wherein a quantum dot of the plurality of quantum dots and the shell around said quantum dot are integrated as a single dendrimer molecule.

21. The photosensitive device of claim 1, wherein for each quantum dot, a thickness of the shell around each quantum dot is in a range of 0.1 to 10 nanometers.

22. The photosensitive device of claim 21, wherein for each quantum dot, the thickness of the shell is equal to no more than 10% of an average cross-sectional thickness through a center of the respective quantum dot.

23. The photosensitive device of claim 1, wherein the photosensitive device is a solar cell.

24. A photosensitive device comprising:
   a plurality of quantum dots, each quantum dot having a shell; and
   an organic matrix, the quantum dots being embedded in the organic matrix,
   at least the quantum dots and the organic matrix being photoconductive semiconductors,
   the shell around each quantum dot being arranged as a tunneling barrier to require hole in a highest occupied molecular orbital (HOMO) of the organic matrix to perform quantum mechanical tunneling to reach the respective quantum dot, and a first quantum state below the band gap in each quantum dot being between a lowest unoccupied molecular orbital (LUMO) and the HOMO of the organic matrix, wave functions of the first quantum state of the plurality of quantum dots to overlap as an intermediate band.

25. The photosensitive device of claim 24, each quantum dot further having a second quantum state, wherein the second quantum state is below the first quantum state and within ±0.16 eV of the HOMO of the organic matrix.

26. The photosensitive device of claim 24, a height of the tunneling barrier being an absolute value of an energy level difference between a peak of the tunneling barrier and the HOMO of the organic matrix, wherein a combination of the height and potential profile of the tunneling barrier and a thickness of the shell around each quantum dot corresponds to a tunneling probability between 0.1 and 0.9 that the hole will tunnel into the respective quantum dot from the organic matrix.

27. The photosensitive device of claim 26, wherein for each quantum dot, the thickness of the shell is in a range of 0.1 to 10 nanometers.

28. The photosensitive device of claim 26, wherein the combination of the height and potential profile of the tunneling barrier and the thickness of the shell around each quantum dot corresponds to a tunneling probability between 0.2 and 0.5 that the hole will tunnel into the respective quantum dot from the organic matrix.

29. The photosensitive device of claim 28, wherein for each quantum dot, the thickness of the shell is in a range of 0.1 to 10 nanometers.

30. The photosensitive device of claim 24, wherein the organic matrix is composed of a photoconductive small molecule semiconductor.

31. The photosensitive device of claim 24, wherein the organic matrix is composed of a photoconductive polymer semiconductor.

32. The photosensitive device of claim 24, wherein each quantum dot is composed of an inorganic semiconductor.

33. The photosensitive device of claim 32, wherein each quantum dot is composed of a compound semiconductor selected from the group consisting of III-V compound semiconductors, II-VI compound semiconductors, PbS, PbSe, PbTe, SiC, and ternary and quaternary alloys thereof.

34. The photosensitive device of claim 32, wherein the shell around each quantum dot is composed of an inorganic semiconductor or an inorganic electrical insulator.

35. The photosensitive device of claim 34, wherein the shell around each quantum dot is composed of a compound semiconductor selected from the group consisting of III-V compound semiconductors, II-VI compound semiconductors, PbS, PbSe, PbTe, SiC, and ternary and quaternary alloys thereof.

36. The photosensitive device of claim 34, wherein the shell around each quantum dot is composed of an inorganic electrical insulator selected from the group consisting of oxides, nitrides, and oxynitrides.

37. The photosensitive device of claim 32, wherein the shell around each quantum dot is composed of an organic semiconductor or an organic electrical insulator.

38. The photosensitive device of claim 37, wherein the shell around each quantum dot is composed of an organic material selected from the group consisting of polymers, thiols, dendrimers, alkane chains, and organic oxides.

39. The photosensitive device of claim 32, further comprising an organic donor layer and an organic acceptor layer in superposed relationship, the quantum dots embedded in the organic matrix being disposed between the donor layer and the acceptor layer, wherein a highest occupied molecular orbital (HOMO) of the acceptor layer is lower than a peak of the tunneling barriers provided by the shells around the quantum dots.

40. The photosensitive device of claim 24, wherein:
each quantum dot is composed of an organic semiconductor, and
the shell around each quantum dot is composed of an organic semiconductor or an organic electrical insulator.

41. The photosensitive device of claim 40, wherein:
each quantum dot is composed of a first organic material selected from the group consisting of a photoconductive small molecule, a photoconductive dendrimer molecule, and a photoconductive polymer molecule; and
the shell around each quantum dot is composed of a second organic material selected from the group consisting of polymers, thiols, dendrimers, alkane chains, and organic oxides.

42. The photosensitive device of claim 40, further comprising an organic donor layer and an organic acceptor layer in superposed relationship, the quantum dots embedded in the organic matrix being disposed between the donor layer and the acceptor layer, wherein a highest occupied molecular orbital (HOMO) of the acceptor layer is lower than a peak of the tunneling barriers provided by the shells around the quantum dots.

43. The photosensitive device of claim 24, wherein a quantum dot of the plurality of quantum dots and the shell around said quantum dot are integrated as a single dendrimer molecule.

44. The photosensitive device of claim 24, wherein for each quantum dot, a thickness of the shell around each quantum dot is in a range of 0.1 to 10 nanometers.

45. The photosensitive device of claim 44, wherein for each quantum dot, the thickness of the shell is equal to no more than 10% of an average cross-sectional thickness through a center of the respective quantum dot.

46. The photosensitive device of claim 24, wherein the photosensitive device is a solar cell.

* * * * *

UNITED STATES PATENT AND TRADEMARK OFFICE
CERTIFICATE OF CORRECTION

| | | |
|---|---|---|
| PATENT NO. | : 7,414,294 B2 | Page 1 of 1 |
| APPLICATION NO. | : 11/304687 | |
| DATED | : August 19, 2008 | |
| INVENTOR(S) | : Stephen R. Forrest | |

It is certified that error appears in the above-identified patent and that said Letters Patent is hereby corrected as shown below:

Column 1, lines 8-11 should appear as follows:
This invention was made with U.S. government support under contract No. "339-4012" --XAT-5-33636-03-- awarded by --the-- U.S. Department of Energy, National Renewable Energy Laboratory. The government has certain rights in "this" --the-- invention.

Signed and Sealed this

Thirtieth Day of December, 2008

JON W. DUDAS
*Director of the United States Patent and Trademark Office*